United States Patent
Abe et al.

(10) Patent No.: US 7,640,660 B2
(45) Date of Patent: Jan. 5, 2010

(54) METHOD FOR MANUFACTURING MULTILAYER WIRING BOARD INCORPORATING CARBON FIBERS AND GLASS FIBERS

(75) Inventors: Tomoyuki Abe, Kawasaki (JP);
 Nobuyuki Hayashi, Kawasaki (JP);
 Motoaki Tani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 33 days.

(21) Appl. No.: 11/737,340

(22) Filed: Apr. 19, 2007

(65) Prior Publication Data
US 2007/0186414 A1    Aug. 16, 2007

Related U.S. Application Data

(60) Division of application No. 11/141,643, filed on Jun. 1, 2005, now Pat. No. 7,224,046, which is a continuation of application No. PCT/JP03/00325, filed on Jan. 16, 2003.

(51) Int. Cl.
 *H05K 3/46* (2006.01)
(52) U.S. Cl. ............... 29/847; 29/830; 29/846; 29/850; 174/255; 174/257; 174/258
(58) Field of Classification Search ............ 29/830, 29/846, 850, 847; 174/255, 257, 258, 260, 174/771; 257/E23.062, E23.006, E23.007, 257/700–703, 668, 758, 774, 680; 361/792–795, 361/751; 428/209, 901
See application file for complete search history.

(56) References Cited

U.S. PATENT DOCUMENTS

| | | | |
|---|---|---|---|
| 4,285,780 A * | 8/1981 | Schachter ............ 205/120 |
| 4,591,659 A | 5/1986 | Leibowitz | |
| 5,436,062 A | 7/1995 | Schmidt et al. | |
| 6,114,005 A | 9/2000 | Nagai et al. | |
| 6,222,740 B1 | 4/2001 | Bovensiepen et al. | |
| 6,479,136 B1 * | 11/2002 | Nakanishi ............ 428/209 |
| 6,625,032 B1 | 9/2003 | Ito et al. | |
| 6,846,528 B2 | 1/2005 | Osumi et al. | |

(Continued)

FOREIGN PATENT DOCUMENTS

JP    60-140898    7/1985

(Continued)

OTHER PUBLICATIONS

U.S. Appl. No. 11/141,643, filed Jun. 1, 2005, Tomoyuki Abe et al.

*Primary Examiner*—A. Dexter Tugbang
*Assistant Examiner*—Livius R Cazan
(74) *Attorney, Agent, or Firm*—Staas & Halsey LLP

(57) ABSTRACT

A multilayer wiring board (X1) comprises a core portion (100) and out-core wiring portion (30). The core portion (100) comprises a carbon fiber reinforced portion (10) composed of a carbon fiber material (11) and resin composition (12), and an in-core wiring portion (20) which has a laminated structure of at least one insulating layer (21) containing a glass fiber material (21a) and a wiring pattern (22) composed of a conductor having an elastic modulus of 10 to 40 GPa and which is bonded to the carbon fiber reinforced portion (10). The out-core wiring portion (30) has a laminated structure of at least one insulating layer (31) and a wiring pattern (32) and is bonded to the core portion (100) at the in-core wiring portion (20).

3 Claims, 10 Drawing Sheets

U.S. PATENT DOCUMENTS

| | | |
|---|---|---|
| 7,038,142 B2 | 5/2006 | Abe |
| 2002/0041032 A1* | 4/2002 | Yamamoto et al. .......... 257/762 |
| 2003/0136577 A1 | 7/2003 | Abe |
| 2005/0252682 A1 | 11/2005 | Shimoto et al. |

FOREIGN PATENT DOCUMENTS

| | | |
|---|---|---|
| JP | 11-40902 | 2/1999 |
| JP | 11-238971 | 8/1999 |
| JP | 2000-340895 | 12/2000 |
| JP | 2001-332828 | 11/2001 |
| JP | 2002-319764 | 10/2002 |
| JP | 2003-8207 | 1/2003 |

* cited by examiner

FIG.8

|  | Anneal Condition | Thickness (μm) | Tensile Strength (MPa) | Elastic Modulus (GPa) |
|---|---|---|---|---|
| Electrolytic Copper Foil | 250°C 30min | 18 | 228 | 22 |
| Electrolytic Copper Foil | No Annealing | 18 | 373 | 72 |
| Rolled Copper Foil | 180°C 30min | 18 | 219 | 30 |
| Rolled Copper Foil | 250°C 30min | 18 | 220 | 21 |
| Rolled Copper Foil | No Annealing | 18 | 441 | 68 |

METHOD FOR MANUFACTURING MULTILAYER WIRING BOARD INCORPORATING CARBON FIBERS AND GLASS FIBERS

CROSS-REFERENCE TO RELATED APPLICATIONS

This application is a Divisional of U.S. patent application Ser. No. 11/141,643 filed Jun. 1, 2005 now U.S. Pat. No. 7,224,046, which is a continuing application, filed under 35 U.S.C. §111 (a), of International Application PCT/JP2003/000325, filed Jan. 16, 2003, which are incorporated herein by reference in their entireties.

BACKGROUND OF THE INVENTION

1. Field of the Invention

The present invention relates to a multilayer wiring board which can be applied to a semiconductor chip mounting board, mother board, probe card board and the like, a method for manufacturing such a board, and a method for manufacturing a fiber reinforced resin board which can be used in manufacturing a multilayer wiring board.

2. Description of the Related Art

Recently, high-density mounting of the electronic components incorporated in the electronics has been developing rapidly along with the demands of a higher performance and miniaturization of electronics. In order to respond to such high-density mounting, a semiconductor chip is often surface mounted on a wiring board in a state of a bear chip, in other words, a semiconductor chip is flip-chip mounted.

As to a wiring board for loading a semiconductor chip, a multilayer wiring board tends to be used, which is suitable for achieving high densification of wiring along with multi-pinning of the semiconductor chip. A semiconductor package having a mounting structure composed of such a semiconductor chip and a multilayer wiring board is further mounted on a mother board so as to constitute a part of a predetermined electronic circuit. As to the mother board as well, a multilayer wiring board, which is suitable for achieving high densification of wiring, is often employed. On the other hand, when examining a semiconductor wafer in which a plurality of semiconductor elements are constructed and a single semiconductor chip, a multilayer wiring board is employed in accordance with the multi-pinning of the element or chip also in a probe card board in which the wafer or chip is loaded.

In flip-chip mounting, generally an underfill agent is applied to fill the space between a wiring board and a semiconductor chip loaded therein. Without the underfill agent to fill in, the reliability of the electrical connection between the wiring board and the semiconductor chip is often low due to the difference in the coefficient of thermal expansion in the in-plane direction between the wiring board and the semiconductor chip. The coefficient of thermal expansion of the semiconductor chips made of a common semiconductor material in the in-plane direction is approximately 3.5 ppm/° C., while the coefficient of thermal expansion of a common wiring board in the in-plane direction in which a glass epoxy board is employed as a core board is 12 to 20 ppm/° C., thus the difference in the coefficient of thermal expansion between the two is relatively large. For this reason, a stress is generated easily in the electrical connection portion between the wiring board and the semiconductor chip loaded therein, due to a change in the ambient temperature or by undergoing a change in the ambient temperature. When at least a predetermined amount of stress is generated in the electrical connection portion, a crack or peeling occurs easily in an interface or the like between a bump of the semiconductor chip and an electrode pad of the wiring board in the connection portion. The underfill agent to fill in the space between the semiconductor chip and the wiring board in flip-chip mounting has a function for relaxing such stress generated in the electrical connection portion. The occurrence of a crack or peeling in the electrical connection portion is suppressed by such a stress relaxation function, whereby connection reliability in flip-chip mounting can be secured.

However, when mounting a large semiconductor chip on a wiring board, sufficient connection reliability often cannot be secured only with the stress relaxation function of the underfill agent. This is because the larger the chip, the more the absolute magnitude of the difference in the thermal expansion between the wiring board and the semiconductor chip becomes, the difference in the thermal expansion being due to the difference in the coefficient of thermal expansion between the wiring board and the semiconductor chip. The larger the difference in the thermal expansion, the larger the stress generated in the electrical connection portion becomes.

Further, when loading a semiconductor wafer or a relatively large semiconductor chip in a probe card and probing and examining the functions thereof, if the difference in the coefficient of thermal expansion between the wafer or chip and the probe card, the electrode of the wafer or chip and the probe pin of the probe card become largely dislocated. As a result, it may not be able to conduct an appropriate testing.

As a means of resolving or diminishing the above-described problems caused by the difference in the coefficient of thermal expansion in the in-plane direction between a wiring board and a semiconductor chip, it is considered to employ a wiring board having a small coefficient of thermal expansion. As the wiring board having a small coefficient of thermal expansion, there has been conventionally known a wiring board in which a metallic material with a low coefficient of thermal expansion is employed as a core board. As the metallic material constituting the metallic core board, generally aluminum, copper, silicon steel, nickel-iron alloy, CIC (copper/invar/cladding material having a laminated structure of copper), or the like is employed. However, since a metallic material is large in its specific gravity to a respectable degree, the weight of a wiring board to be obtained becomes large, thus employing a metallic core board may not be preferred. Moreover, the metallic core board exhibits poor processability in fine processing, thus, for example, it is often difficult to perforate it or make it a thin plate.

On the other hand, as a means of reducing the coefficient of thermal expansion of a wiring board, there has been known a technology where a carbon fiber material is used. Such a technology is disclosed in Japanese Patent Application Laid-Open No. S60-140898, Japanese Patent Application Laid-Open No. H11-40902, and Japanese Patent Application Laid-Open No. 2001-332828.

Japanese Patent Application Laid-Open No. S60-140898 discloses a multilayer wiring board having a multilayer wiring structure in which are alternately laminated copper wiring and a graphite layer as an insulating layer containing a carbon fiber sheet. The coefficient of thermal expansion of a carbon fiber is approximately −1 to 1 ppm/° C. (25° C.) in general, and since the above multilayer wiring board comprises a graphite layer that contains such carbon fiber sheet having a small coefficient of thermal expansion, the coefficient of thermal expansion of the multilayer wiring board is small. According to Japanese Patent Application Laid-Open No. S60-140898, however, the multilayer wiring structure of such a wiring board is formed by means of a so-called "integral lamination technique". It is known in the integral lamination technique that it is difficult to form a fine multilayer wiring structure and therefore fine pitch electrodes for external connection. For this reason, the wiring board disclosed in Japanese Patent Application Laid-Open No. S60-140898 is not suitable for loading a semiconductor chip in which electrodes for external connection are formed in fine pitch.

Japanese Patent Application Laid-Open No. H11-40902 discloses a multilayer wiring board having a multilayer wiring structure in which are laminated, on both faces of a core board containing a carbon fiber sheet as a base material, carbon wiring and an insulating layer composed of a prepreg containing a glass fiber. Since the core board comprises the carbon fiber sheet, the coefficient of thermal expansion of the wiring board is small. According to Japanese Patent Application Laid-Open No. H11-40902, however the multilayer wiring structure of such wiring board is formed by means of the integral lamination technique. For this reason, the wiring board disclosed in Japanese Patent Application Laid-Open No. H11-40902 is not suitable for loading a semiconductor chip in which electrodes for external connection are formed in fine pitch.

Japanese Patent Application Laid-Open No. 2001-332828 discloses a wiring board having a laminated structure in which are laminated, on both faces of a core board composed of an insulating layer containing a carbon fiber, copper wiring and an insulating layer composed of a prepreg which does not contain a glass fiber. However, the difference in the coefficient of thermal expansion between the core board composed of the insulating layer containing a carbon fiber and a prepreg which does not contain a glass fiber is large to a respectable degree. If the difference in the coefficient of thermal expansion is large, the core board and the insulating layer are easily separated from each other. When the insulating layer separates from the core board, unreasonable stress acts on the wiring that is formed on the insulating layer, whereby the wiring may be broken. Therefore, according to the technology disclosed in Japanese Patent Application Laid-Open No. 2001-332828, it may be difficult to appropriately create a wiring board having an entirely small coefficient of thermal expansion.

SUMMARY OF THE INVENTION

The present invention has been proposed under such circumstances, and the object thereof is to provide a multilayer wiring board capable of comprising a fine wiring structure and of appropriately obtaining a low coefficient of thermal expansion, a method for manufacturing the multilayer wiring board, and a method for manufacturing a fiber reinforced resin board which can be used in manufacturing the multilayer wiring board.

According to a first aspect of the present invention, a multilayer wiring board is provided. This multilayer wiring board comprises a laminated structure constituted by a core portion and an out-core wiring portion. The core portion comprises: a carbon fiber reinforced portion composed of a carbon fiber material and a resin composition; and an in-core wiring portion which has a laminated structure of at least one insulating layer containing a glass fiber material and a wiring pattern composed of a conductor having an elastic modulus of 10 to 40 GPa, the in-core wiring portion being bonded to the carbon fiber reinforced portion. The out-core wiring portion has a laminated structure of a at least one insulating layer and a wiring pattern, the out-core wiring portion being bonded to the core portion at the in-core wiring portion.

A multilayer wiring board of such configuration can comprise a fine wiring structure. The out-core wiring portion in the multilayer wiring board according to the first aspect of the present invention has a laminated structure of an insulating layer and a wiring pattern. The insulating layer does not contain a fibrous member such as a carbon fiber material, glass fiber material or the like. For this reason, the out-core wiring portion can be formed by means of a so-called "build-up process". In formation of a laminated wiring structure such as a multilayer wiring structure by means of the build-up process, it has been known that a fine wiring pattern can be formed at high density. Therefore, regarding the out-core wiring portion in the present invention, the fine wiring can be formed at high density by means of the build-up process.

Since the out-core wiring portion can comprise fine wiring, an electrode portion for external connection can be provided in fine pitch in the uppermost or outermost wiring pattern of the out-core wiring portion. In this case, in the multilayer wiring board according to the first aspect of the present invention, it is possible to mount or load a semiconductor chip in which are formed electrodes for external connection in fine pitch. Since the multilayer wiring board according to the first aspect of the present invention can comprise fine wiring as described above, the multilayer wiring board can appropriately accommodate to multi-pinning, i.e. high-density mounting, of the semiconductor chip.

In the multilayer wiring board according to the first aspect of the present invention, lowering of coefficient of thermal expansion can be appropriately achieved. Specifically, according to the multilayer wiring board in the first aspect, the net coefficient of thermal expansion of the entire multilayer wiring board can be appropriately reduced between the carbon fiber reinforced portion and the in-core wiring portion, and between the in-core wiring portion and the out-core wiring portion, while achieving good bonded states therebetween.

The carbon fiber reinforced portion contains a carbon fiber material as a base material. The carbon fiber material includes, for example, a carbon fiber mesh, carbon fiber cloth, carbon fiber nonwoven fabric, and carbon fiber in the form of chopped fiber. Alternatively, the carbon fiber material includes a carbon fiber having a cross-laminated structure of a unidirectional carbon fiber sheet. The carbon fiber material generally indicates a small coefficient of thermal expansion of approximately −1 to 1 ppm/°C. (25°C.). In the inside of the carbon fiber reinforced portion, the carbon fiber material having such a small coefficient of thermal expansion spreads in an in-plane direction of the resin portion. Therefore, the coefficient of thermal expansion of the carbon fiber reinforced portion in the in-plane direction can be set small to a respectable degree by selecting a form of the carbon fiber material and adjusting the content of the carbon fiber material in the carbon fiber reinforced material. The coefficient of thermal expansion of the entire multilayer wiring board in the in-plane direction strongly depends on the coefficient of thermal expansion of the carbon fiber reinforced portion. Therefore, the coefficient of thermal expansion of the multilayer wiring board in the in-plane direction can be set to a value proximate to that of the semiconductor chip by, for example, adjusting the content of the carbon fiber material in the carbon fiber reinforced portion.

In the in-core wiring portion, the insulating layer comprises a glass fiber material, and the semiconductor pattern is formed from a conductor having an elastic modulus of 10 to 40 GPa. The elastic modulus is a so called "longitudinal modulus (Young's modulus)". According to such a configuration, the coefficient of thermal expansion of the in-core wiring portion can be appropriately adjusted between the coefficient of thermal expansion of the above-mentioned carbon fiber reinforced portion and the coefficient of thermal expansion of the out-core wiring portion.

The glass fiber material has a coefficient of thermal expansion that is larger than that of the carbon fiber material, and has a coefficient of thermal expansion that is smaller than that of the resin material. Further, the glass fiber material spreads in a spread direction of the surface of the insulating layer in the inside the insulating layer of the in-core wiring portion. Accordingly, the coefficient of thermal expansion of the insulating layer itself of the in-core wiring portion takes a value between the coefficient of thermal expansion of the carbon fiber reinforced portion and the coefficient of thermal expansion of the out-core wiring portion in which the insulating layer composed of a resin material, which does not contain a base material, makes up a significant volume.

Moreover, the wiring pattern of the in-core wiring portion is formed from a conductor having a low elastic modulus of 10 to 40 GPa. Such a wiring pattern having a low elastic modulus is soft enough to appropriately follow the thermal expansion of the insulating layer in the in-core wiring portion, thus the coefficient of thermal expansion of the insulating layer is dominant in the coefficient of thermal expansion of the entire in-core wiring portion. Specifically, when the insulating layer to which a wiring pattern is bonded in the in-core wiring portion has a coefficient of thermal expansion that is smaller than that of the wiring pattern, expansion of the wiring pattern when heating it is nearly as small as thermal expansion of the insulating layer, which does not unduly conduce to the thermal expansion of the insulating layer. Since the wiring pattern is sufficiently soft (with low elasticity), expansion of the wiring pattern when heating it is suppressed by the insulating layer which has a smaller coefficient of thermal expansion. When the insulating layer to which a wiring pattern is bonded has a coefficient of thermal expansion that is larger than that of the wiring pattern, expansion of the wiring pattern when heating it is nearly as large as thermal expansion of the insulating layer, which does not unduly hamper the thermal expansion of the insulating layer. Since the wiring pattern is sufficiently soft (with low elasticity), the wiring pattern, when heating it, follows the insulating layer that expands even larger. In this manner, the wiring pattern formed from a conductor having a low elastic modulus of 10 to 40 GPa does not hamper thermal expansion of the insulating layer which makes up a significant volume in the in-core wiring portion. Therefore, the net coefficient of thermal expansion of the in-core wiring portion is not unduly affected by the coefficient of thermal expansion of the wiring pattern, and can be set appropriately, in a high degree of freedom, between the coefficient of thermal expansion of the carbon fiber reinforced portion and the coefficient of thermal expansion of the out-core wiring portion.

The multilayer wiring board according to the first aspect of the present invention comprises, as described above, the carbon fiber reinforced portion having a low coefficient of thermal expansion in order to sufficiently reduce the coefficient of thermal expansion of the entire board, the out-core wiring board in which fine wiring can be formed but the difference in the coefficient of thermal expansion is relatively large as compared to the carbon fiber reinforced portion, and the in-core wiring portion which can set the coefficient of thermal expansion appropriately so as to have a middle coefficient of thermal expansion between the coefficient of thermal expansion of the carbon fiber reinforced portion and the coefficient of thermal expansion of the out-core wiring portion without being unduly affected by the wiring pattern. Therefore, according to the multilayer wiring board of the first aspect, the net coefficient of thermal expansion of the entire multilayer wiring board can be reduced, while the bonded state between the carbon fiber reinforced portion and in-core wiring portion, and the bonded state between the in-core wiring portion and out-core wiring portion are maintained in a good condition.

As above, according to the first aspect of the present invention, the multilayer wiring board can comprise a fine wiring structure, and lowering of coefficient of thermal expansion can be appropriately achieved in the multilayer wiring board. Such a multilayer wiring board is provided in fine pitch with an electrode portion for external connection and is fundamentally suitable for loading a semiconductor chip having a low coefficient of thermal expansion.

According to a second aspect of the present invention, another multilayer wiring board is provided. This multilayer wiring board comprises a laminated structure composed of: a core portion, a first out-core wiring portion and a second out-core wiring portion. The core portion comprises: first and second in-core wiring portions, each having a laminated structure of at least one insulating layer containing a glass fiber material and a wiring pattern composed of a conductor having an elastic modulus of 10 to 40 GPa; and a carbon fiber reinforced portion which is composed of a carbon fiber material and resin composition and is interposed between the first and second in-core wiring portions. The first out-core wiring portion has a laminated structure of at least one insulating layer and a wiring pattern and is bonded to the core portion at the first in-core wiring portion. The second out-core wiring portion has a laminated structure of at least one insulating layer and a wiring pattern and is bonded to the core portion at the second in-core wiring portion.

The multilayer wiring board with such configuration comprises a configuration of the multilayer wiring board of the first aspect of the present invention. Therefore, the same effects as in the first aspect as described above are obtained in the second aspect of the present invention as well. In addition, the multilayer wiring board of the second aspect has a symmetrical laminated structures Specifically, the two in-core wiring portions are disposed on both sides of the carbon fiber reinforced portion, and also the two out-core wiring portions are disposed on both sides of the carbon fiber reinforced portion. Accordingly, the configuration related to the second aspect is suitable for reducing the warpage of the multilayer wiring board.

According to a third aspect of the present invention, another multilayer wiring board is provided, which has a laminated structure of a core portion, a first out-core wiring portion and a second out-core wiring portion The core portion comprises: first and second carbon fiber reinforced portions, each composed of a carbon fiber material and resin composition; a glass fiber reinforced portion which is composed of a glass fiber material and resin composition and is interposed between the first and second carbon fiber reinforced portions; a first in-core wiring portion which has a laminated structure of at least one insulating layer containing a glass fiber material and a wiring pattern composed of a conductor having an elastic modulus of 10 to 40 GPa, the first in-core wiring portion being bonded to the first carbon fiber reinforced portion at a side opposite from the glass fiber reinforced portion; and a second in-core wiring portion which has a laminated structure of at least one insulating layer containing a glass fiber material and a wiring pattern composed of a conductor having an elastic modulus of 10 to 40 GPa, the second in-core wiring portion being bonded to the second carbon fiber reinforced portion at a side opposite from the glass fiber reinforced portion. The first out-core wiring portion has a laminated structure of at least one insulating layer and a wiring pattern and is bonded to the core portion at the first in-core wiring portion. The second out-core wiring portion has a laminated structure of at least one insulating layer and a wiring pattern and is bonded to the core portion at the second in-core wiring portion.

Such a wiring board comprises the configuration of the wiring board related to the first aspect of the present invention. Therefore, the same effects as in the first aspect as described above are obtained in the third aspect of the present invention as well. In addition, the configuration of the third aspect has a symmetrical laminated structure and thus is suitable for reducing the warpage of the wiring board.

Preferably, the carbon fiber reinforced portion has a through-hole via which extends in a thickness direction of the carbon fiber reinforced portion and is coated with an insulating material. According to such configuration, the wiring pattern in the out-core wiring portion can be electrically conducted to the opposite side of the carbon fiber reinforced portion through the through-hole via. Moreover, since the through-hole via is coated with the insulating material, the insulation state between the carbon fiber material and the through-hole via can be secured appropriately within the carbon fiber reinforced portion.

Preferably, the conductor that configures the wiring pattern is electrolytic copper foil or rolled copper foil. Electrolytic copper foil or rolled copper foil can be used appropriately as a material for forming a wiring pattern which constitutes the insulating layer and a laminated structure.

Preferably, the resin composition of the carbon fiber reinforced portion contains filler. In this case, it is preferred that the content of the filler in the resin composition be 5 to 30 vol %. Further, the filler is composed of, for example, $SiO_2$, $Si_3N_4$, $Al_2O_3$, AlN, $ZrO_2$, mullite, borosilicate glass, aluminosilicate glass, alumino-borosilicate glass, quartz glass, or carbon black. When the resin composition of the carbon fiber reinforced portion contains filler, the coefficient of thermal expansion decreases isotropically in the resin composition. Therefore, it is often preferred that filler be added to the resin composition in order to reduce the coefficient thermal expansion of the carbon fiber reinforced portion.

Preferably, the carbon fiber material is a mesh, woven fabric, nonwoven fabric, or is in the form of chopped fiber, or alternatively has a cross-laminated structure of a unidirectional carbon fiber sheet. In the cross-laminated structure of a unidirectional carbon fiber sheet, a plurality of sheets in which a plurality of carbon fibers are arranged in one direction are layered such that the carbon fibers in parallel directions cross between the adjacent sheets. Preferably, the content of the carbon fiber material in the carbon fiber reinforced portion is 30 to 80 vol %. The coefficient of thermal expansion of the carbon fiber reinforced portion can be adjusted by selecting a form of the carbon fiber material and adjusting the content of the carbon fiber material in the carbon fiber reinforced material.

According to a fourth aspect of the present invention, a method for manufacturing the multilayer wiring board is provided. This manufacturing method comprises an annealing step of annealing conductive foil for forming a first wiring pattern such that the elastic modulus of the conductive foil becomes 10 to 40 GPa, a step of forming, on the carbon fiber reinforced portion composed of a carbon fiber material and resin composition, a first wiring portion having a laminated structure of at least one insulating layer containing a carbon fiber material and the first wiring pattern formed from the conductive foil, and a step of forming, on the first wiring portion, a second wiring portion having a laminated structure composed of at least one insulating layer and the second wiring pattern.

According to such a method, the multilayer wiring board related to the first aspect can be appropriately manufactured. According to the fourth aspect of the present invention, therefore, the same effects as in the first aspect as described above are obtained in the multilayer wiring board to be manufactured.

In the fourth aspect of the present invention, the conductive foil is preferably electrolytic copper foil, which is annealed in the annealing step at 200 to 300° C. Such a range of heating temperatures in the annealing step is suitable for reducing the elastic modulus of the electrolytic copper foil to 10 to 40 GPa. Rolled copper foil can be used instead of electrolytic copper foil as the conductive foil. In this case, rolled copper foil is annealed in the annealing step at 150 to 250° C. Such a range of heating temperatures in the annealing step is suitable for reducing the elastic modulus of the rolled copper foil to 10 to 40 GPa before forming the wiring.

In a fifth aspect of the present invention, another method for manufacturing the multilayer wiring board is provided. This manufacturing method comprises a step of heat treatment at 150° C. or above and other treatment for the purpose of forming, on the carbon fiber reinforced portion composed of a carbon fiber material and resin composition, a first wiring portion having a laminated structure of at least one insulating layer containing a glass fiber material and a first wiring pattern formed from rolled copper foil, and a step of forming, on the first wiring portion, a second wiring portion having a laminated structure of at least one insulating layer and a second wiring pattern.

The elastic modulus of the rolled copper foil can be reduced significantly at a heating temperature of 150° C. or above. Furthermore, the heating temperature at a time of pressing by means of a so-called "integral lamination technique", which is used when forming the first wiring portion and in-core wiring portion, usually exceeds 150° C. According to the fifth aspect of the present invention, therefore, when using rolled copper foil as the conductive foil for forming the first wiring pattern of the first wiring portion, a wiring pattern with a low elastic modulus of 10 to 40 GPa can be formed in the first wiring portion without subjecting the conductive foil to the annealing treatment beforehand.

According to a sixth aspect of the present invention, a method for manufacturing a fiber reinforced resin board is provided. This manufacturing method comprises a lay-up step for interposing a resin material containing a resin composition between a first carbon fiber reinforced plate, which is composed of a carbon fiber material and a resin composition and has a first through-hole, and a second carbon fiber reinforced plate, which is composed of a carbon fiber material and a resin composition and has a second through-hole corresponding to the first through-hole, and a step of pressure-bonding the first carbon fiber reinforced plate to the second carbon fiber reinforced plate by means of the resin material such that the resin composition in the resin material is packed into the first through-hole and the second through-hole.

According to such a method, it is possible to appropriately manufacture a fiber reinforced resin board which can be used to manufacture a core portion or core board comprising the carbon fiber reinforced portion. In the sixth aspect of the present invention, the resin composition pushes out the foams from within the direction of the thickness of the laminated structural body to enter into each through-hole for through-hole via formation, which is provided on the two carbon fiber reinforced plates. According to the sixth aspect of the present invention, therefore, it is possible to pack the through-holes while preventing the foams from being mixed into the through-holes in the carbon fiber reinforced portion.

In the sixth aspect of the present invention, the resin material is preferably a glass fiber reinforced plate composed of a glass fiber and resin composition. According to such configuration, a board having a laminated structure of the carbon fiber reinforced portion and the glass fiber reinforced portion can be manufactured. This board can be suitably used to form the core portion described in the third aspect of the present invention.

BRIEF DESCRIPTION OF THE DRAWINGS

FIG. 8 is a table which lists the physical properties of various copper foils;

DETAILED DESCRIPTION OF THE PREFERRED EMBODIMENTS

Figure 1:
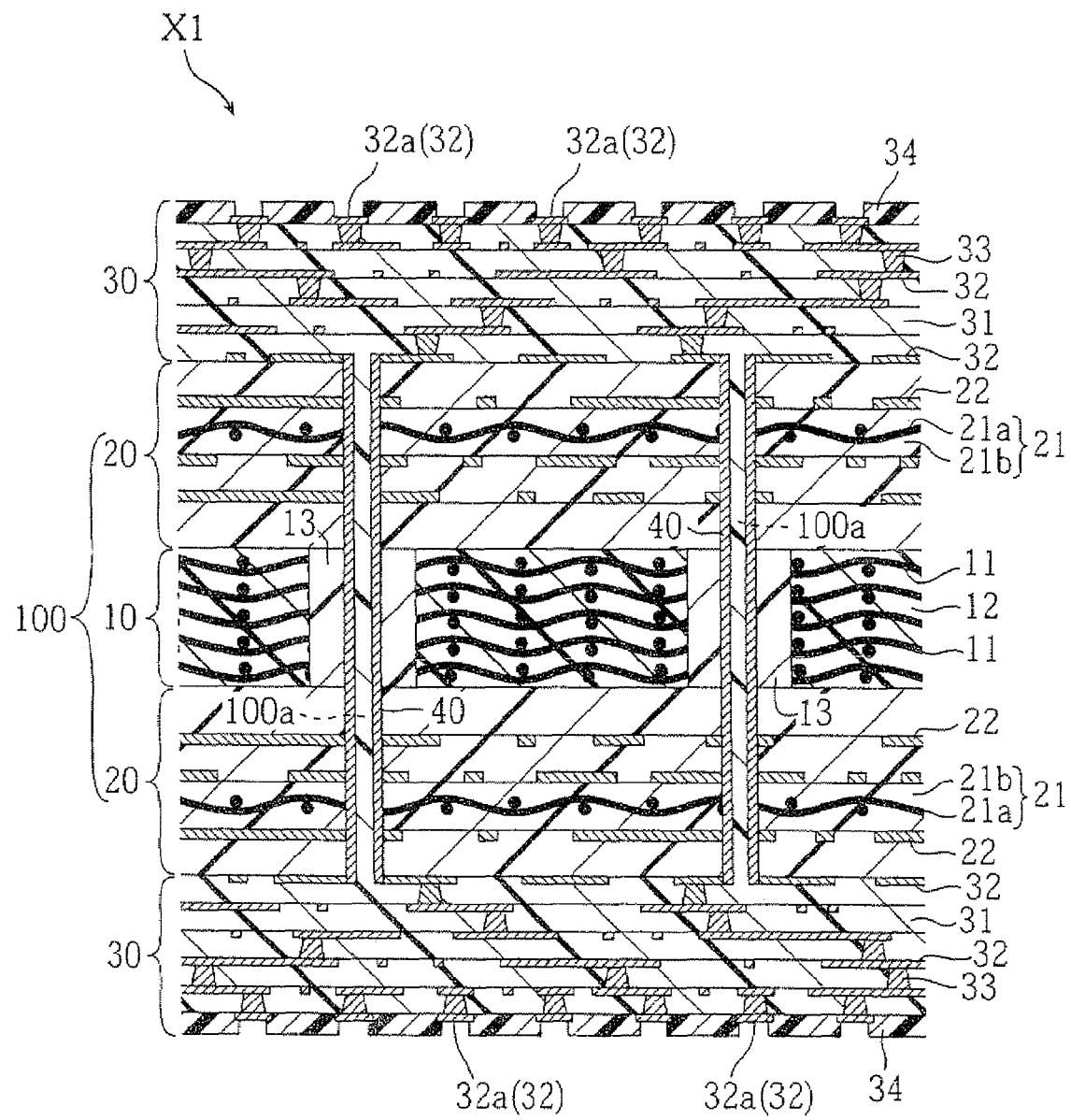
FIG. 1 is a partial cross-sectional view of a multilayer wiring board according to a first embodiment of the present invention.

FIG. 1 is a partial cross-sectional view of a multilayer wiring board X1 according to a first embodiment of the present invention. The multilayer wiring board X1 comprises a core board 100 having a laminated structure of a carbon fiber reinforced (CFR) portion 10 and two in-core wiring portions 20, and two build-up portions 30 formed by lamination on both sides of the core board 100. The core board 100 is provided with through-hole vias 40 extending in a direction of the thickness of the core board.

The CFR portion 10 is obtained by processing a plate material of a carbon fiber reinforced plastic (CFRP), and is composed of a carbon fiber material 11, resin material 12 which wraps the carbon fiber material and is cured, and insulating resin portion 13.

In the present embodiment, the carbon fiber material 11 is a carbon fiber cloth woven out of carbon fiber yarn obtained by bundling carbon fibers together, and is disposed such that it spreads in a spread direction of the surface of the CFR portion 10. In the present embodiment, five carbon fiber materials 11 are laminated in the thickness direction and buried in the resin material 12. As the carbon fiber material 11, a carbon fiber mesh, carbon fiber nonwoven fabric, or carbon fiber in the form of chopped fiber may be used instead of a carbon fiber cloth. Alternatively, a carbon fiber having a cross-laminated structure of a unidirectional carbon fiber sheet may be used as the carbon fiber material. The content of the carbon fiber material 11 in the CFR portion 10 is 30 to 80 vol %. In the present embodiment, the average coefficient of thermal expansion between 25° C. and 150° C. in the spread direction of the surface of the CFR portion 10 is set to be at least −1 ppm/° C. and less than 10 ppm/° C. by these configurations.

The resin material 12 which wraps the carbon fiber material 11 may include, for example, polysulfone, polyethersulfone, polyphenylsulfone, polyphthalamide, polyamide imide, polyketone, polyacetal, polyimide, polycarbonate, modified polyphenylene ether, polyphenylene oxide, polybutylene terephthalate, polyacrylate, polysulfone, polyphenylene sulfide, polyetheretherketon, tetrafluoroethylene, epoxy, cyanate ester, bismalimide, and the like.

The insulating resin portion 13 is for securing electrical insulation between the carbon fiber material 11 of the CFR portion 10 and the through-hole via 40. The resins that are listed above regarding the resin material 12 can be employed as the material for configuring the insulating resin portion 13.

The in-core wiring portion 20 is an area in which multilayered wiring is formed by means of a so-called "integral lamination technique", and has a laminated structure of an insulating layer 21 and a wiring pattern 22.

The insulating layer 21 is formed by using a prepreg which is obtained by impregnate a glass cloth 21a with a resin material 21b, where the resin is cured. In FIG. 1 the glass cloth 21a is shown only in the insulating layer 21 that is a third layer from the CFR portion 10 side, and other insulating layers 21 are omitted, in view of the simplification of the figure. As the resin material 21b for configuring the insulating layer 21, for example, the resins that are listed above regarding the resin material 12 can be employed. In the present embodiment, the average coefficient of thermal expansion between 25° C. and 150° C. in a spread direction of the surface of the insulating layer 21 is set to at least 10 ppm/° C. and less than 20 ppm/° C.

Each wiring pattern 22 has a desired shape due to a conductor with an elastic modulus of 10 to 40 GPa (250° C.). The conductor can be obtained by, for example, annealing electrolytic copper foil or rolled copper foil under a predetermined condition. The wiring patterns 22 in respective layers are electrically connected with each other by the through-hole via 40.

The build-up portion 30 is an area in which multilayered wiring is formed by means of a so-called "build-up technique", and has a laminated structure of an insulating layer 31 and a wiring pattern 32.

The insulating layer 31 can be configured by, for example, the resins that are listed above regarding the resin material 12. In the present embodiment, the average coefficient of thermal expansion between 25° C. and 150° C. in a spread direction of the surface of the insulating layer 31 is set to be at least 20 ppm/° C. and less than 100 ppm/° C.

In the present embodiment, each wiring pattern 32 is configured by copper plating and has a desired shape. The wiring patterns 32 formed on adjacent layers are connected with each other by vias 33. An electrode pad 32a for external connection is formed on the uppermost or outermost wiring pattern 32. The uppermost surface of the build-up portion 30 is provided with an overcoat layer 34 which is opened with respect to the electrode pad 32a.

The through-hole via 40 is for electrically connecting to each other the wiring structures provided on both sides of the core board 100, that is, the wiring structures of the wiring pattern 22 in the in-core wiring portion 20 and of the wiring pattern 32 in the build-up portion 30. The through-hole via 40 is formed by, for example, copper plating in a through-hole 100a which is formed so as to pass through the core board 100. In the present invention, the through-hole via may be formed by packing a conductive paste containing silver powder or copper powder into the through-hole 100a, instead of or in addition to performing copper plating.

FIG. 2A to FIG. 7D show a method for manufacturing the multilayer wiring board X1. In FIG. 2A to FIG. 7D the manufacturing processes for the multilayer wiring board X1 are illustrated by means of partial cross-sectional views.

Figure 2A:
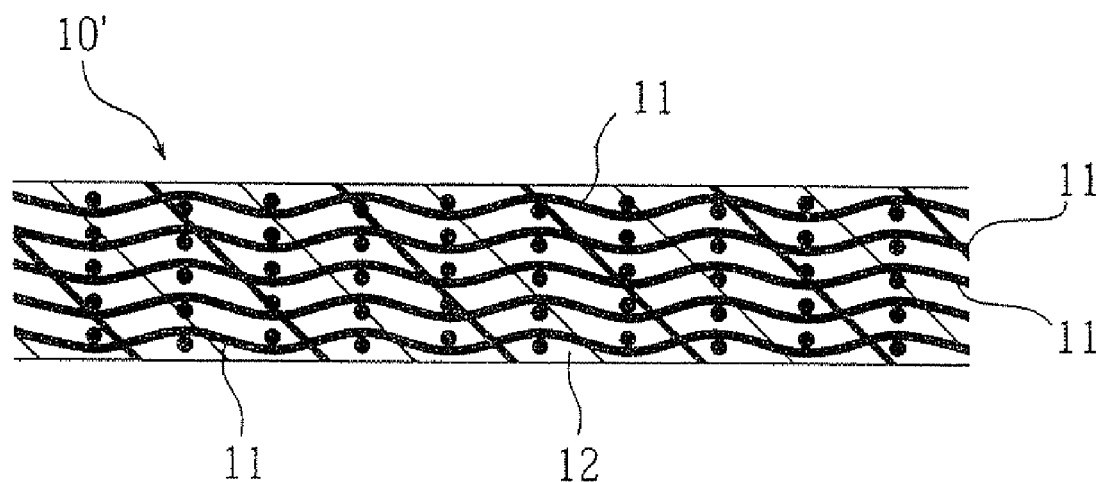
FIG. 2A and FIG. 2B show partial steps of a method for manufacturing the multilayer wiring board shown in FIG. 1.

In manufacture of the multilayer wiring board X1, first of all, a CFRP plate 10' as shown in FIG. 2A is prepared. In the present embodiment the CFRP plate 10' is composed of five carbon fiber materials 11 and the resin material 12 which wraps the carbon fiber materials and is cured. When creating the CFRP plate 10', first of all, for example, one carbon fiber material 11 is impregnated with the resin material 12 in liquid form. Next, by drying the resin material 12 while maintaining the uncured state thereof, a carbon fiber reinforced prepreg is created. Then, five prepregs created in the above manner are laminated and applied with pressure in the lamination direction under application of heat, whereby the five prepregs are integrated. Consequently the CFRP plate 10' can be created. In view of the simplification of the figure, the carbon fiber material 11 is omitted in the subsequent process drawings regarding the manufacturing method of the multilayer wiring board X1.

Figure 2B:
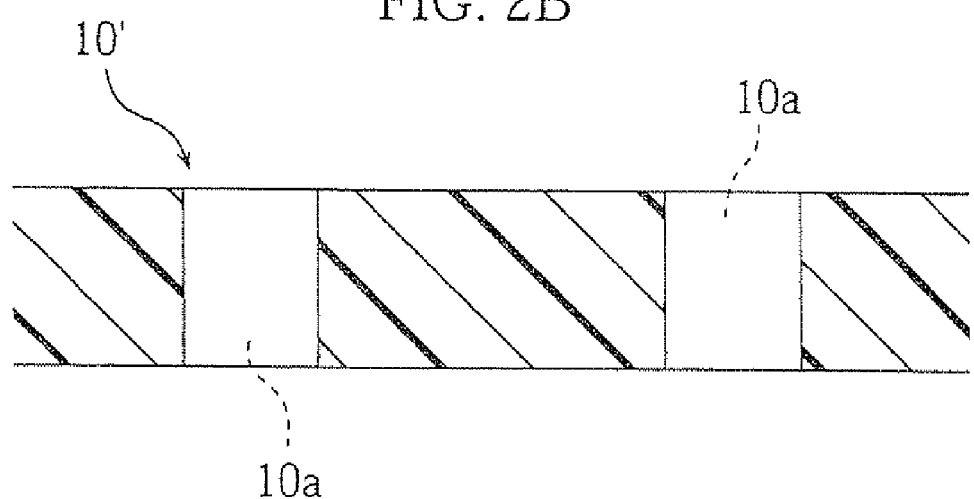

Next, as shown in FIG. 2B, a through-hole 10a is formed in a predetermined place of the CFRP plate 10'. The through-hole 10a is formed to have a mouth diameter that is larger than the diameter of the cross section of the abovementioned through-hole via 40. Specifically, the mouth diameter of the through-hole 10a is 0.2 to 1.0 mm larger than the diameter of the through-hole via 40. As a means of forming the through-hole 10a, cutting processing by means of a drill, punching processing by means of a punching mold, or laser ablation processing can be employed.

Figure 3A:
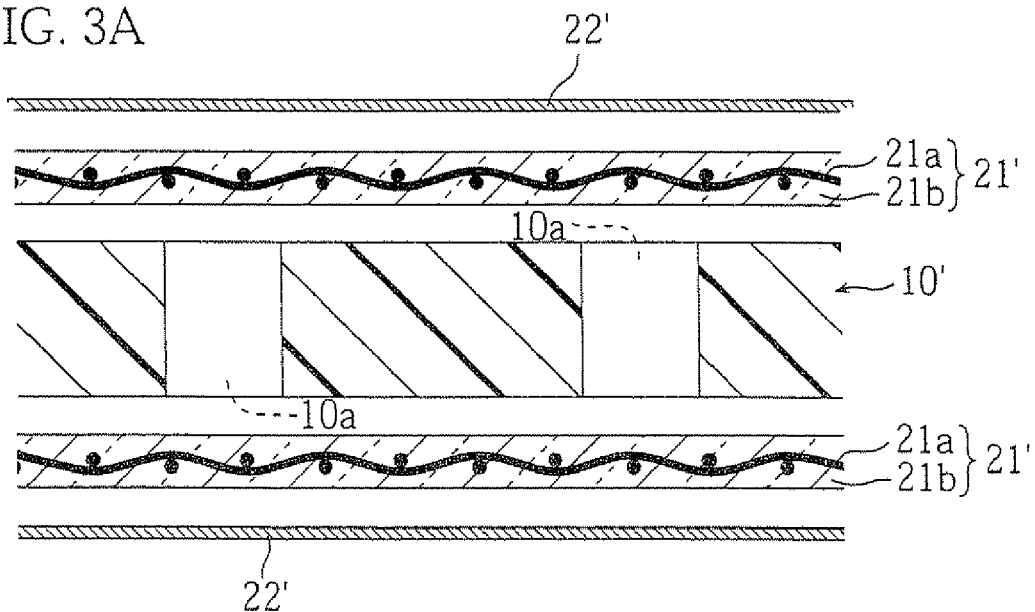
FIG. 3A to FIG. 3C show steps that follows FIG. 2B.

Then, the CFRP plate 10' processed in the above manner, a prepreg 21', and copper foil 22' are laid up in the order shown in FIG. 3A.

The prepreg 21' is composed of the glass cloth 21a, and the uncured resin material 21b which wraps the glass cloth 21a. The prepreg 21' can be created by, for example, impregnating the glass cloth 21a with the resin material 21b in liquid form and thereafter drying the resin material 21b while maintaining the uncured state thereof. In view of the simplification of the figure, the glass cloth 21a is omitted in the figures subsequent to FIG. 3A regarding the manufacture of the multilayer wiring board X1.

The copper foil 22' is electrolytic copper foil or rolled copper foil, and has an elastic modulus (Young's modulus) of 10 to 40 GPa. The thickness of the copper foil 22' is, for example, 18 μm. In the present embodiment, the copper foil 22' is subjected to the annealing treatment before the lay-up step shown in FIG. 3A such that the elastic modulus thereof becomes 10 to 40 GPa. In the case of electrolytic copper foil, it is preferred that the heating temperature be set to 200 to 300° C. and the heating time be set to 0.5 to 2 hours in the annealing treatment. Further, in the case of rolled copper foil, it is preferred that the heating temperature be set to 150 to 250° C. and the heating time be set to 0.5 to 2 hours. FIG. 8 shows an example of the physical properties of various copper foils. As shown in FIG. 8, the electrolytic copper foil and rolled copper foil may show an elastic modulus in the range of 10 to 40 GPa through the annealing treatment. On the other hand, the commercially available electrolytic copper foil and rolled copper foil that did not undergo the annealing treatment show a high elastic modulus of at least 60 GPa or high rigidity.

The elastic modulus of a copper ingot is approximately 130 GPa in general, and, according to this value, the elastic modulus of electrolytic copper foil and rolled foil that are offered commercially in general show a high elastic modulus of at least 60 GPa. In the present embodiment, by subjecting such copper foil having a high elastic modulus or high rigidity to the annealing treatment once, the elastic modulus of the copper foil can be reduced. It is known that recrystallization of the copper proceeds by undergoing an annealing treatment, and as a result, the crystallinity of the copper is improved, thereby reducing the elastic modulus.

In the present invention, when rolled copper foil is used as the copper foil 22', sometimes the annealing treatment may not be carried out separately. Since the elastic modulus of rolled copper foil can be reduced significantly at a heating temperature of 150° C. or above, in the step of forming the in-core wiring portion 20, for example, when the copper foil 22' is heated for a sufficient amount of time at 150° C. or above, a low elastic modulus of 10 to 40 GPa can be achieved in the copper foil 22' without subjecting it to annealing treatment beforehand.

Figure 3B:
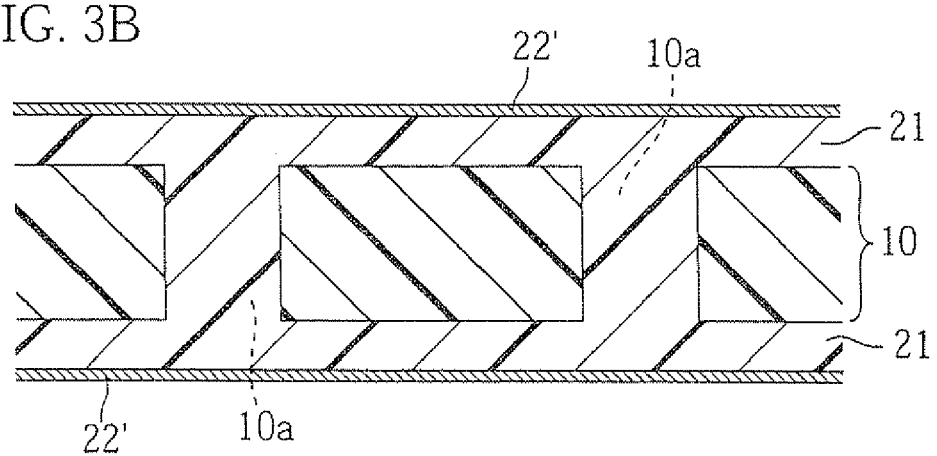

Next, in manufacture of the multilayer wiring board X1, the laminated structures laid up in the order as shown in FIG. 3A are pressed under application of heat in the thickness direction. Accordingly, as shown in FIG. 3B, the resin material 21b of the prepreg 21' is heat cured, whereby the CFRP plate 10' and the copper foil 22' are integrated. At this time, the through-hole 10a of the CFRP plate 10' is packed with the resin material 21b originating in the prepreg 21'. Packing the through-hole 10a may be performed beforehand by using a resin material, which is different from the resin material 21b originating in the prepreg 21', as the plugging resin, before performing such integral lamination Consequently, the lowermost or innermost insulating layer 21 in the in-core wiring portion 20 and the CFR portion 10 are formed.

Figure 3C:
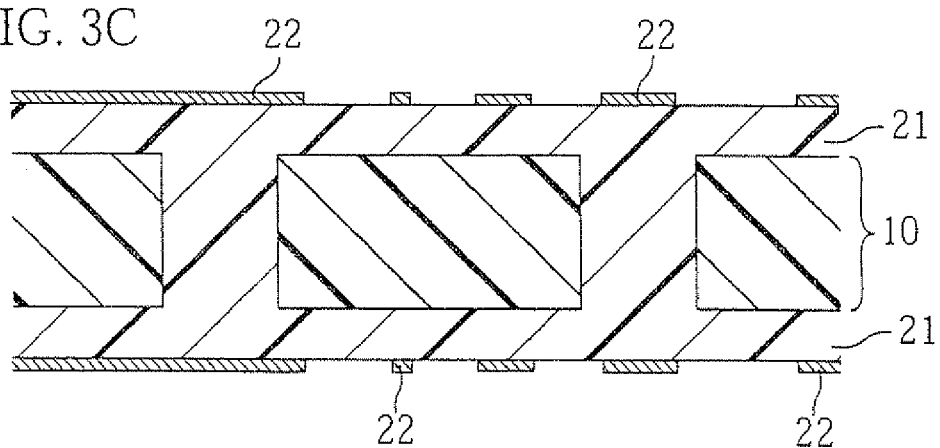

Next, as shown in FIG. 3C, the copper foil 22' is patterned, whereby the lowermost or innermost wiring pattern 22 in the in-core wiring portion 20 is formed. In formation of the wiring pattern 22, first, a resist pattern is formed on the copper foil 22'. This resist pattern has a predetermined shape of a masking pattern corresponding to the wiring pattern 22. With the resist pattern as a mask, the copper foil 22' is then subjected to an etching treatment, whereby the wiring pattern 22 is formed. Cupric chloride solution can be used as an etchant. This etchant can be used for subsequent copper etching. And thereafter the resist pattern is separated.

Figure 4A:
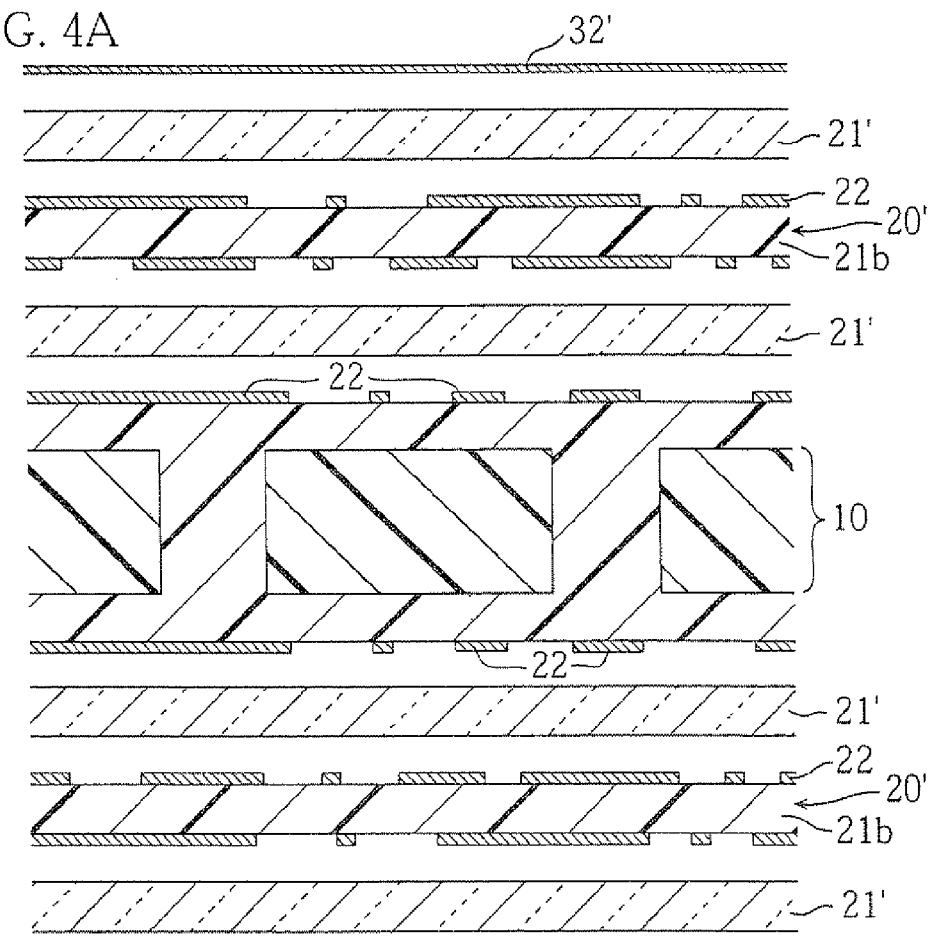
FIG. 4A and FIG. 4B show steps that follows FIG. 3C.

Then, the lamination structural body formed in the above manner, the prepreg 21', a laminated plate 20', and copper foil 32' are laid up in the order shown in FIG. 4A.

Each laminated plate 20' is obtained by processing a double-sided copper clad sheet, and is composed of the glass cloth 21a, the resin material 21b which wraps the glass cloth 21a and is cured, and a predetermined wiring pattern 22. When creating the laminated plate 20', first of all, for example, the glass cloth 21a is impregnated with the resin material 21b in liquid form. Next, by drying the resin material 21b while maintaining the uncured state thereof, a glass cloth reinforced prepreg is created. Then, the prepreg obtained as above is applied with pressure, heated and thereby heat cured, and in the meantime the copper foil is pressure-bonded to each side of the copper clad sheet. In the present embodiment, the copper foil described above is subjected to an annealing treatment in advance so that the elastic modulus thereof becomes 10 to 40 GPa. After forming the resist pattern on the copper foil which is the object of wiring formation, the copper foil is subjected to an etching treatment, with the resist pattern as a mask, whereby the wiring pattern 22 is formed. Thereafter, the resist pattern is separated. In this manner, laminated plates 20' which respectively have predetermined wiring patterns 22 are created.

The prepreg 21' is created in the same way as the one used when forming the innermost insulating layer 21. Further, the copper foil 32' has a thickness of, for example, 5 µm. The copper foil 32' is used when the lowermost wiring pattern 32 in the build-up portion 30 is formed.

Figure 4B:
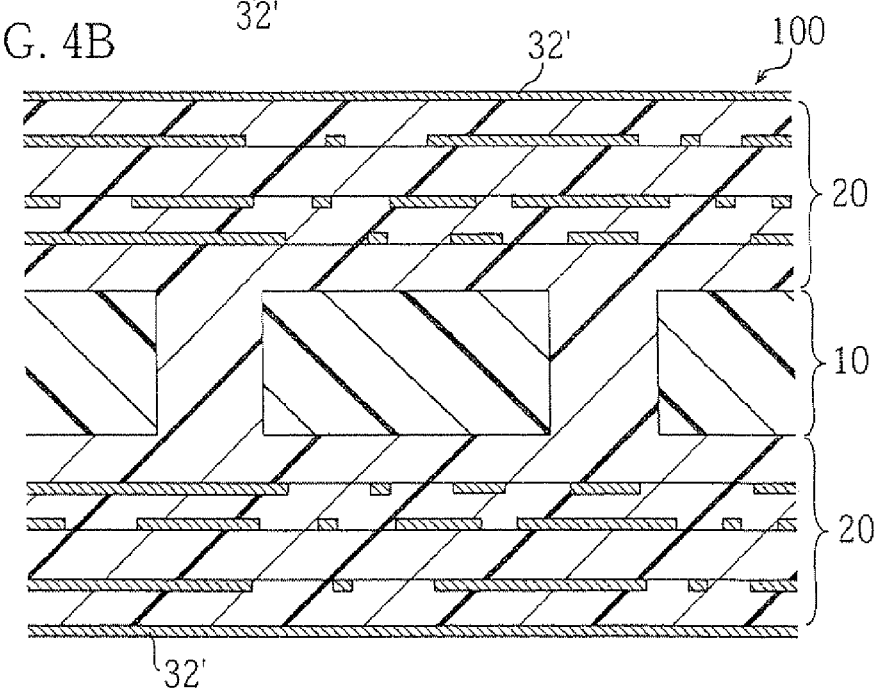

In manufacture of the multilayer wiring board X1, the laminated structural bodies laid up in the order as shown in FIG. 4A are pressed under application of heat in the thickness direction. Accordingly, as shown in FIG. 4B, the resin material 21b of the prepreg 21' is heat cured, whereby the CFR portion 10, laminated plate 20', and the copper foil 32' are integrated. In this manner, the core board 100 having the in-core wiring portion 20 is formed.

In formation of the multilayer wiring structure of the in-core wiring portions 20, in addition to the techniques of the present embodiment, the in-core wiring portions may be formed one layer by one layer as described above with reference to FIG. 3A to FIG. 3C with respect to all the wiring patterns 22. Alternatively, with respect to all the wiring patterns 22, the in-core wiring portions may be formed integrally by using the laminated plate 20', as described above, on which the wiring pattern 22 is already formed with reference to FIG. 4A and FIG. 4B.

Figure 5A:
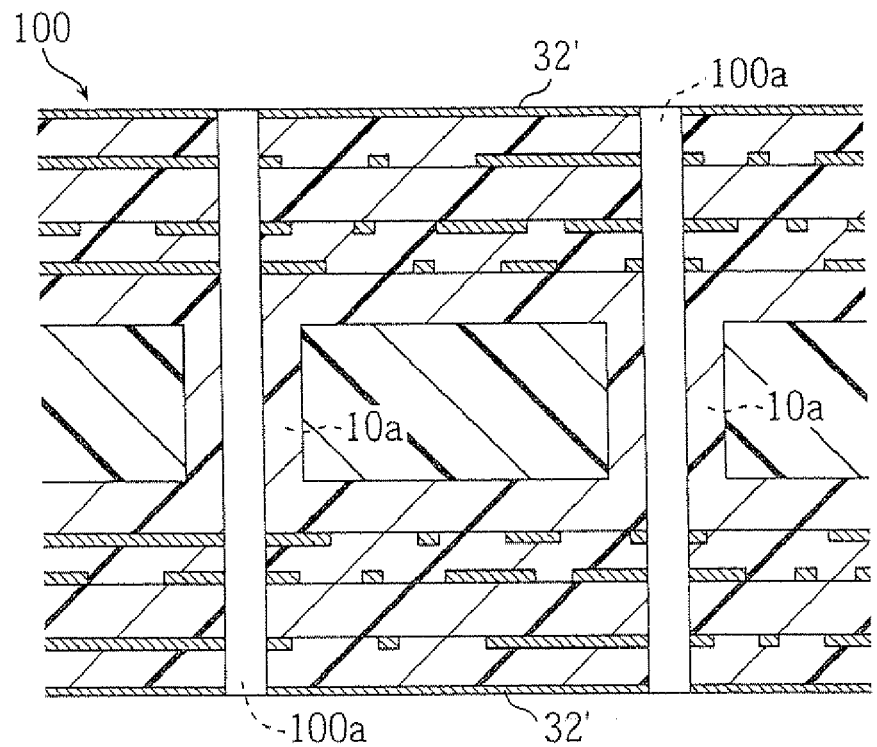
FIG. 5A and FIG. 5B show steps that follows FIG. 4B.

Next, in manufacture of the multilayer wiring board X1, as shown in FIG. 5A, the through-hole 10a is formed in the core board 100. The through-hole 100a is formed such that it passes through the through-hole 10a. For the formation method of the through-hole 100a, the same processing method as the one described above for the through-hole 10a can be employed.

Figure 5B:
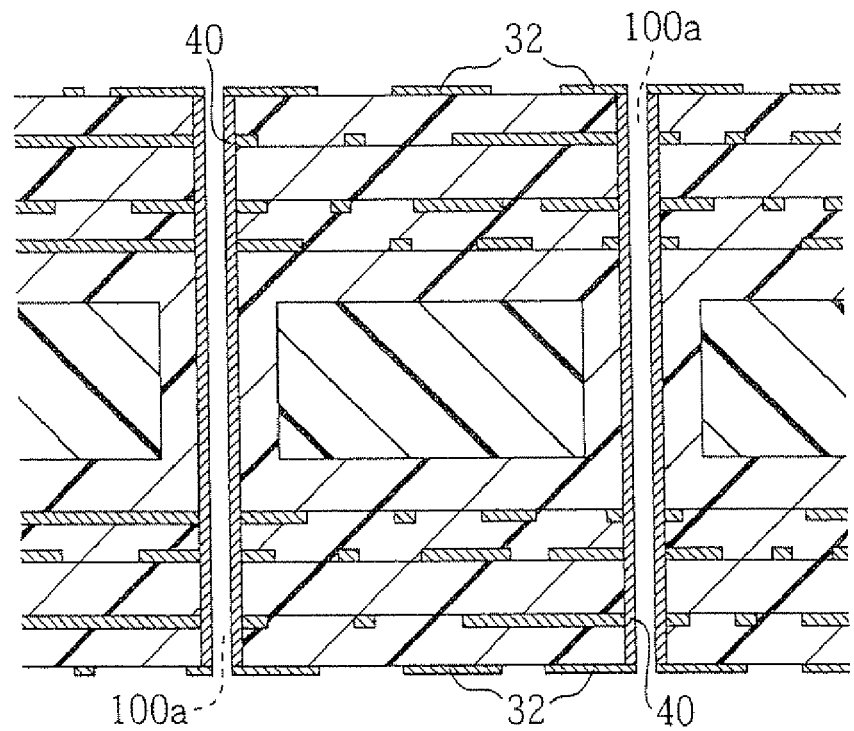

Next, as shown in FIG. 5B, along with forming the innermost wiring pattern 32 of the build-up portion 30 on the both faces of the core board 100, the through-hole via 40 is formed on the through-hole 100a. Specifically, first of all, for example, a desmear treatment is performed on the inner wall of the through-hole as necessary, and thereafter electroless plating is used to form an electroless copper plating film on the inner wall of the through-hole. At this time, a thin electroless copper plating film is formed on the copper foil 32' as well. Then, a predetermined resist pattern corresponding to the wiring pattern 32 is formed on the copper foil 32'. With the resist pattern as a mask, the electroless copper plating film is used as a seed layer to grow an electroplated copper film on the electroless copper plating film by means of electroplating. Consequently, the through-hole via 40 is formed on the through-hole 100a. The resist pattern is then removed, and thereafter the copper foil 32', which is not covered with the electroplated copper film, and the electroless copper plating film thereon are removed by etching. Consequently, the wiring pattern 32 is formed.

Figure 6:
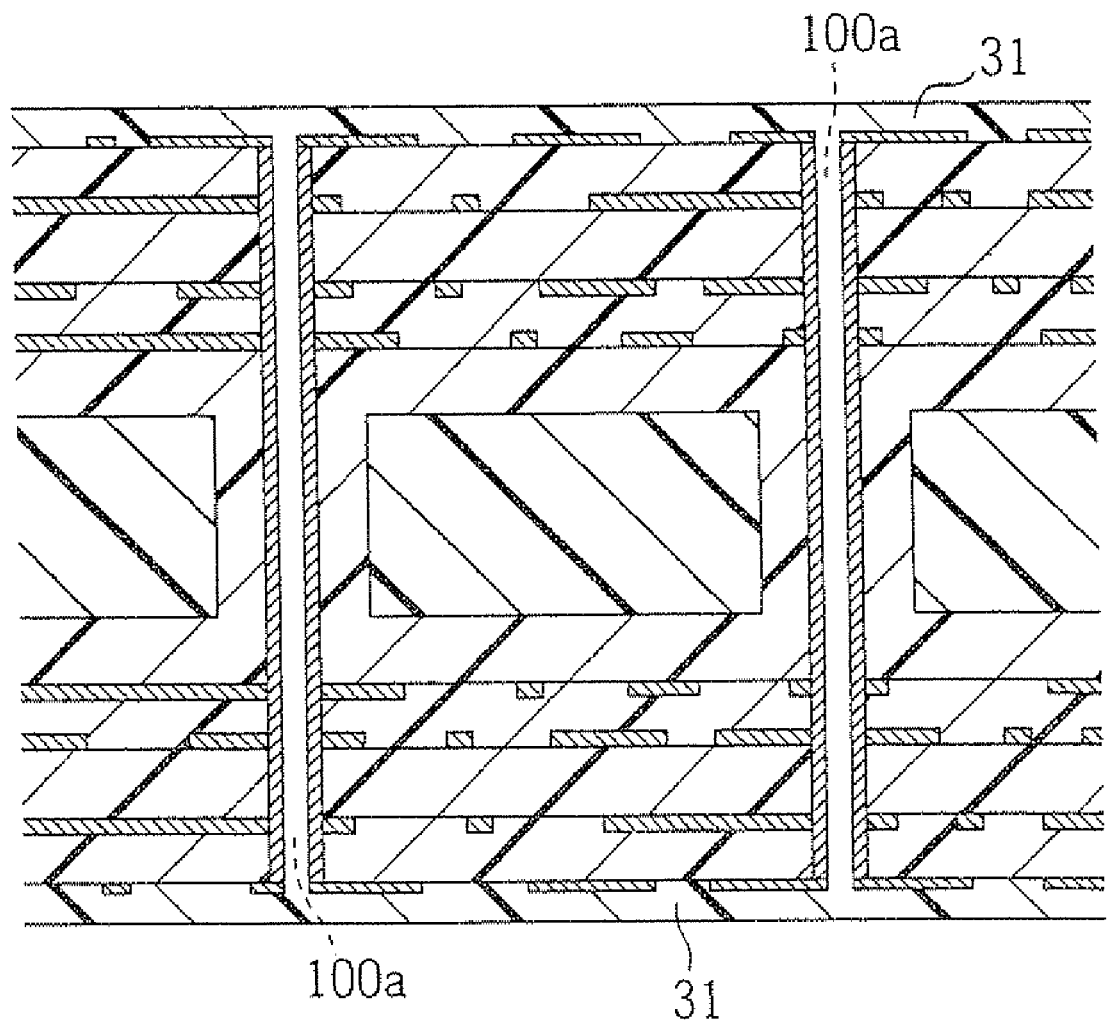
FIG. 6 shows a step that follows FIG. 5B.

Next, as shown in FIG. 6, the innermost insulating layer 31 of the build-up portion 30 is formed on the both faces of the core board 100. Specifically, a predetermined resin material is deposited on the surface of the core board 100. At this time, for example, by depressurizing the inside of the through-hole 100a in which the through-hole via 40 is formed, the resin material is drawn into the through-hall 100a, whereby the through-hall 100a is packed with the resin material. Packing the through-hole 100a may be performed by using a resin material, which is different from the resin material for forming the lowermost insulating layer 31 in the build-up portion 30, as the plugging resin before forming the build-up portion 30.

Figure 7A:
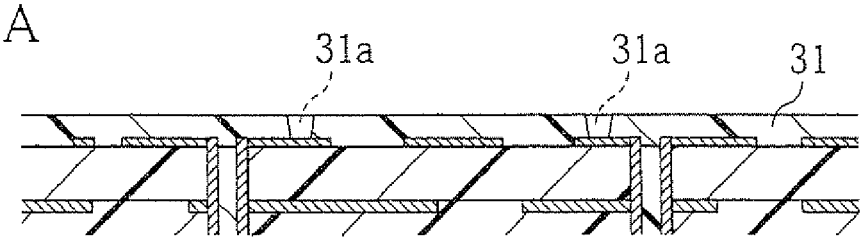
FIG. 7A to FIG. 7D show steps that follows FIG. 6.

Next, as shown in FIG. 7A, a via hole 31a is formed on the insulating layer 31. The via hole 31a can be formed by means of a dry-etching method where a UV-YAG laser, carbon dioxide gas laser, excimer laser, or plasma is used. Alternatively the via hole 31a can be formed by means of photolithography when the insulating layer 31 is formed by using a photosensitive resin. The figures subsequent to FIG. 7A show the formation processes for one side of the build-up portion 30.

Figure 7B:
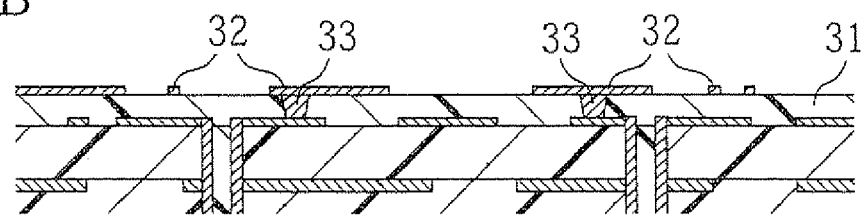

As shown in FIG. 7B, a semi-additive process is used to form a via 33 in the via hole 31a, along with forming the wiring pattern 32 on the insulating layer 31. Specifically, first of all, a desmear treatment is performed as necessary to roughen the surfaces of the insulating layer 31 and the via hole 31a, and thereafter electroless plating is used to form electroless copper plating films on the surfaces of the insulating layer 31 and the via hole 31a. Then, a photoresist is deposited on the electroless copper plating film, which is then exposed to light and developed, whereby a resist pattern is formed. The resist pattern is formed while leaving, on the insulating layer 31, a non-mask region corresponding to the wiring pattern 32 which is the object of formation. By means of electroplating, the electroless copper plating film is used as a seed layer to stack an electroplated copper film in the non-mask region. The resist pattern is then removed by etching, and thereafter the electroless copper plating film, which was till then covered with the resist pattern, is removed by etching. In this manner the wiring pattern 32 and the via 33 can be formed.

Figure 7C:
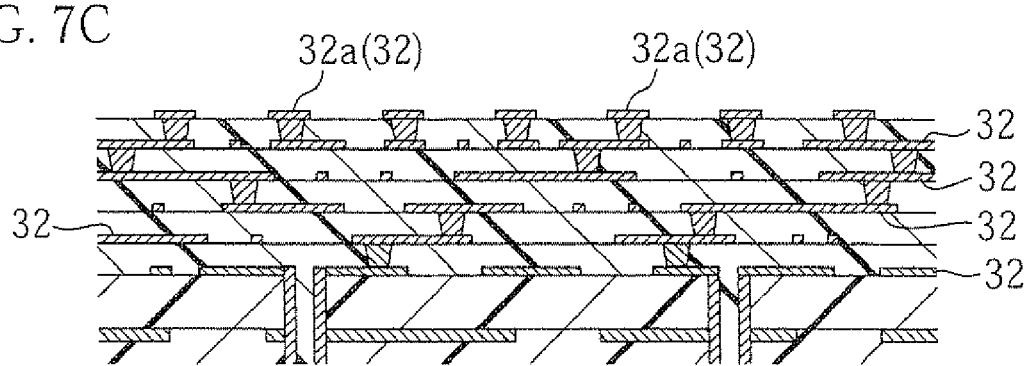

In manufacture of the multilayer wiring board X1, the formation of the insulating layer 31 and the formation of the wiring pattern 32 and via 33 by means of such a build-up process are repeated predetermined times, whereby a build-up multilayer wiring structure as shown in FIG. 7C is formed. In the present embodiment, the number of lamination of the wiring pattern 32 is six, and the electrode pad 32a for external connection is formed in the outermost wiring pattern 32.

Figure 7D:
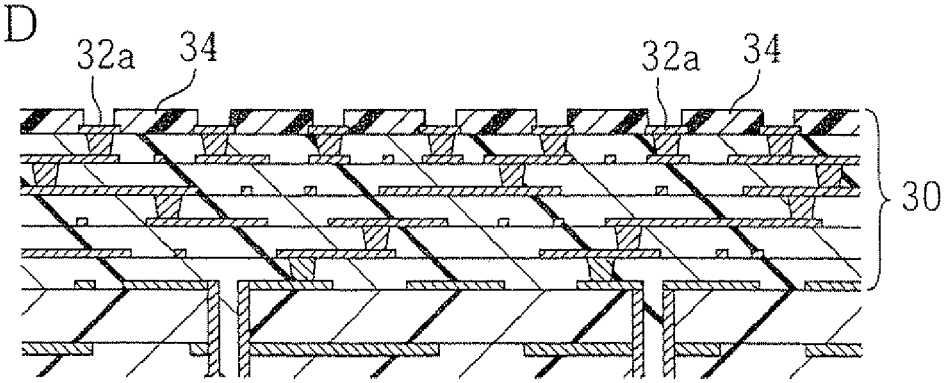

Next, as shown in FIG. 7D, the overcoat layer 34 is formed on the surface of the build-up multilayer wiring structure. The overcoat layer 34 is opened with respect to the electrode pad 32a. In formation of the overcoat layer 34, first of all, a resin material for overcoat layer is deposited on the build-up multilayer wiring structure by using a printing technique. Then, a predetermined opening is formed by means of photolithography. In this manner, the build-up portion 30 which has build-up multilayer wiring and whose surface is coated with the overcoat layer 34 is formed. The steps described above with reference to FIG. 7A to FIG. 7B are performed concurrently on the both sides of the core board 100.

As above, the multilayer wiring board X1, which comprises the core board 100 having a lamination structure of the CFR portion 10 and in-core wiring portion 20, and the build-up portion 30 formed by lamination on the both faces of the core board 100, is manufactured.

The multilayer wiring board X1 has a fine and highly densified wiring structure in the build-up portion 30, and, in the outermost wiring pattern 32 of the build-up portion 30, can be provided in fine pitch with the electrode pad 32a for external connection. Therefore, the multilayer wiring board X1 is suitable for mounting or loading a semiconductor chip in which the electrode for external connection are formed in fine pitch.

The CFR portion 10 of the multilayer wiring board X1 comprises the carbon fiber material 11 with extremely small coefficient of thermal expansion. The average coefficient of thermal expansion between 25° C. and 150° C. of the entire multilayer wiring board X1 having such CFR portion 10 is, in the present embodiment, 3 to 5 ppm/° C. In such multilayer wiring board X1 with a small coefficient of thermal expansion, the difference in the coefficient of thermal expansion between the semiconductor chips is small, thus deterioration of the connection reliability due to the difference in the coefficient of thermal expansion can be prevented in a state where the semiconductor chips are loaded.

In the multilayer wiring board X1, good bonded states are achieved between the CFR portion 10 and in-core wiring portion 20, as well as between the in-core wiring portion 20 and build-up portion 30. The multilayer wiring board X1 comprises the CFR portion 10 having low coefficient of thermal expansion for sufficiently lowering the coefficient of thermal expansion of the entire board, and the buildup portion 30 in which fine wiring is formed by the build-up process and which has relatively large coefficient of thermal expansion. When the CFR portion 10 and the build-up portion 30 are supposedly bonded directly to each other, peeling occurs between them due to the relatively large difference in the coefficient of thermal expansion between them. In the multilayer wiring board X1, the in-core wiring portion 20, which indicates a mean value of the coefficient of thermal expansion of the CFR portion 10 and of the build-up portion 30, is interposed between the CFR portion 10 and the build-up portion 30.

In the multilayer wiring board X1, the wiring pattern 20 is soft since it has an elastic modulus of 10 to 40 GPa, thus the net coefficient of thermal expansion of the in-core wiring portion 20 is set appropriately between the coefficient of thermal expansion of the carbon fiber reinforced portion 10 and the coefficient of thermal expansion of the out-core wiring portion 20, without being unduly affected by the coefficient of the thermal expansion of the wiring pattern 22. As with the in-core wiring portion 20, in the multilayer wiring structure formed by a so-called "integral lamination technique", generally, the coefficient of thermal expansion of the insulating layer is larger than that of the conductor that configures the wiring pattern, and the elastic modulus of the conductor is larger than that of the insulating layer. When the conductor configuring the wiring pattern has an excessive elastic modulus of, for example, at least 60 GPa, the wiring pattern with high elastic modulus causes relatively large stress to be generated during thermal expansion, thus the coefficient of thermal expansion of the wiring pattern is dominant in the net coefficient of thermal expansion of the multilayer wiring structure. As a result, it may be difficult to desirably adjust the net coefficient of thermal expansion of the multilayer wiring structure. On the other hand, in the present invention the wiring pattern 22 in the in-core wiring portion 20 is composed of a conductor having a low elastic modulus of 10 to 40 GPa. Such wiring pattern 22 with low elastic modulus is soft enough to appropriately follow thermal expansion of the insulating layer 21 of the in-core wiring portion 20, and as a result the coefficient of thermal expansion of the insulating layer 21 becomes dominant in the coefficient of thermal expansion of the entire in-core wiring portion 20. Therefore, the net coefficient of thermal expansion of the in-core wiring portion 20 is not unduly affected by the coefficient of thermal expansion of the wiring pattern 22, and can be set appropriately in a high degree of freedom between the coefficient of thermal expansion of the carbon fiber reinforced portion 10 and the coefficient of thermal expansion of the out-core wiring portion 20. In the multilayer wiring board X1 comprising the in-core wiring portion 20 whose coefficient of thermal expansion is appropriately set in a high degree of freedom, the bonded state between the CFR portion 10 and in-core wiring portion 20 and the bonded state between the in-core wiring portion 20 and build-up portion 30 can be well maintained, even when the ambient temperature changes or when undergoing a change in the ambient temperature.

Figure 9:
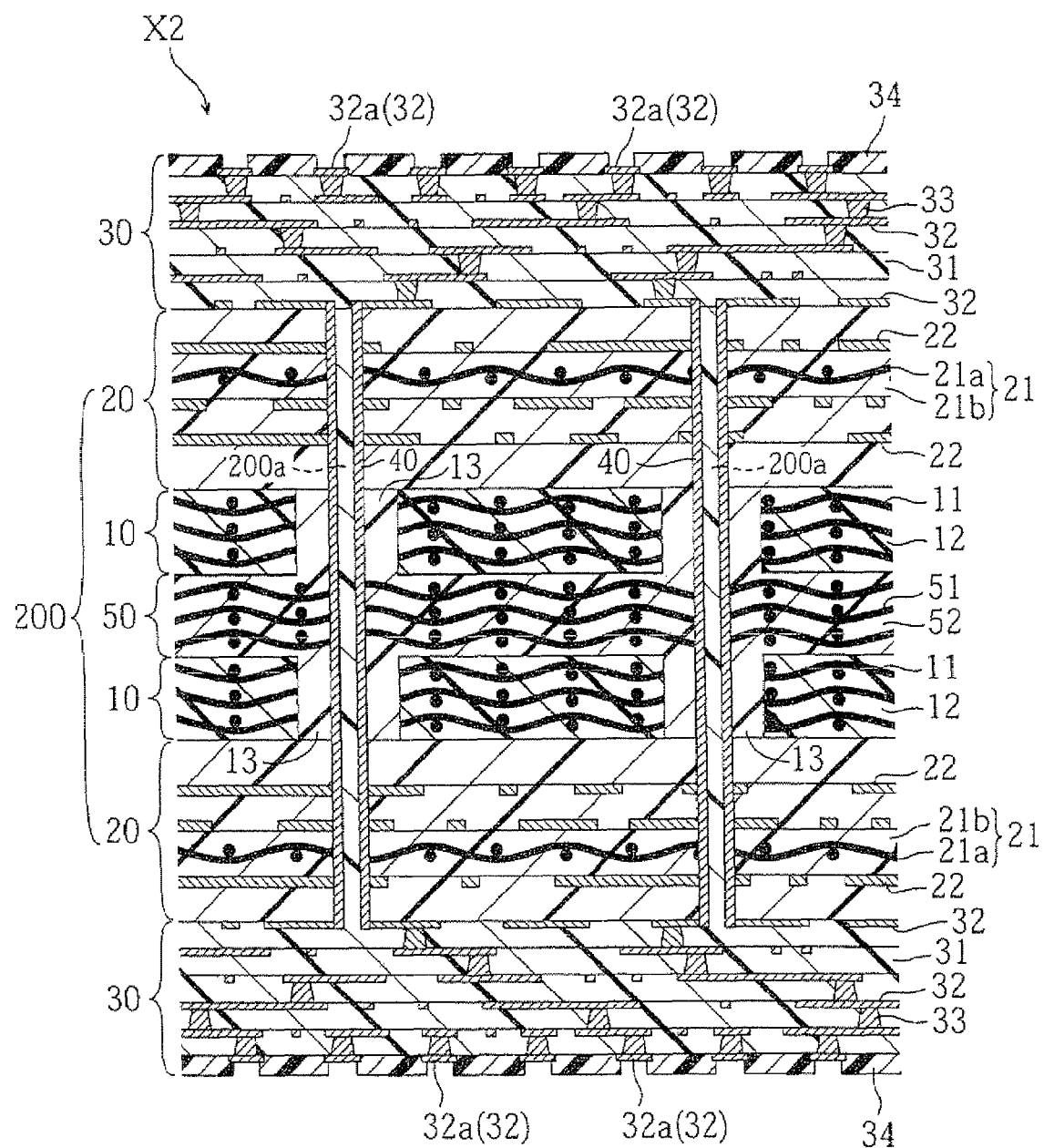
FIG. 9 is a partial cross-sectional view of a multilayer wiring board according to a second embodiment of the present invention.

FIG. 9 is a partial cross-sectional view of a multilayer wiring board X2 according to a second embodiment of the present invention. The multilayer wiring board X2 comprises a core board 200 having a lamination structure of a glass fiber reinforced (GFR) portion 50, two CFR portions 10, and two in-core wiring portions 20, and two build-up portions 30 formed by lamination on both faces of the core board 200. The core board 200 is provided with a through-hole via 40 extending in a thickness direction of the core board.

The GFR portion 50 is obtained by processing a plate material of a glass fiber reinforced plastic (GFRP), and is composed of a glass fiber material 51 and a resin material 52 which wraps the glass fiber material and is cured.

The glass fiber material 51 is, for example, a glass cloth, and is disposed such that it spreads in a spread direction of the surface of the GFR portion 50. In the present embodiment, three glass fiber materials 51 are laminated in the thickness direction and buried in the resin material 52. The content of the glass fiber material 51 in the GFR portion 50 is 20 to 50 vol %.

As the resin material 52 that wraps the glass fiber material 51, for example, the materials that are listed above regarding the resin material 12 can be employed.

The CFR portion 10 is obtained by processing a plate material of a carbon fiber reinforced plastic (CFRP), and is composed of a carbon fiber material 11, resin material 12 which wraps the carbon fiber material and is cured, and insulating resin portion 13. Each CFR portion 10 in the present embodiment has the same configuration as that of the CFR portion 10 in the first embodiment, except that three carbon fiber materials 11 are laminated.

The in-core wiring portion 20 is an area in which multilayered wiring is formed by means of a so-called "integral lamination technique", and has a laminated structure of the insulating layer 21 and wiring pattern 22. The build-up portion 30 is an area in which multilayered wiring is formed by means of a so-called "build-up technique", and has a laminated structure of the insulating layer 31 and wiring pattern 32. The uppermost surface of the build-up portion 30 is provided with the overcoat layer 34. The through-hole via 40 is for electrically connecting to each other the wiring structures provided on both sides of the core board 200, that is, the wiring structures of the wiring pattern 22 in the in-core wiring portion 20 and of the wiring pattern 32 in the build-up portion 30. The through-hole via 40 is formed by, for example, copper plating in a through-hole 200a which is formed so as to pass through the core board 200.

Other configurations of the in-core wiring portion 20, build-up portion 30, and through-hole via 40 are same as those described above for the first embodiment. In FIG. 9 the glass cloth 21a included in the insulating layer 21 in the in-core wiring portion 20 is shown only in the insulating layer 21 that is a third layer from the CFR portion 10 side, and other insulating layers 21 is omitted, in view of the simplification of the figure.

FIG. 10 shows a part of the manufacturing steps of the multilayer wiring board X2. In FIG. 10 the manufacturing processes of the multilayer wiring board X2 are shown by means of partial cross-sectional drawings.

Figure 10A:
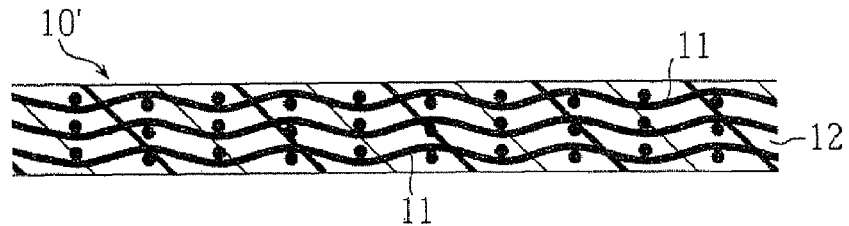
FIG. 10A to FIG. 10D show partial steps of a method for manufacturing the multilayer wiring board shown in FIG. 9.

In manufacture of the multilayer wiring board X2, firs of all, the CFRP plate 10' as shown in FIG. 10A is prepared. In the present embodiment the CFRP plate 10 is composed of three carbon fiber materials 11 and the resin material 12 which wraps the carbon fiber materials and is cured.

Figure 10B:
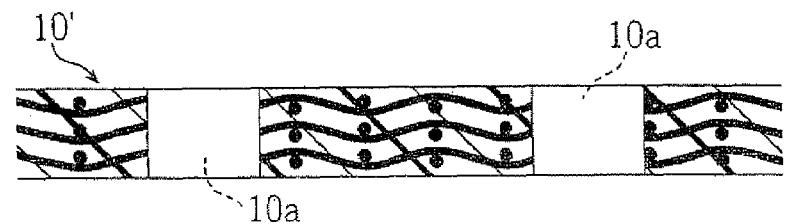

Next, as shown in FIG. 10B, a through-hole 10a is formed in a predetermined place of the CFRP plate 10'. The through-hole 10a is formed to have a mouth diameter that is larger than the diameter of the cross section of the abovementioned through-hole via 40. Specifically, the mouth diameter of the through-hole 10a is 0.2 to 1.0 mm larger than the diameter of the through-hole via 40. As a means of forming the through-hole 10a, cutting processing by means of a drill, punching processing by means of a punching mold, or laser ablation processing can be employed.

Figure 10C:
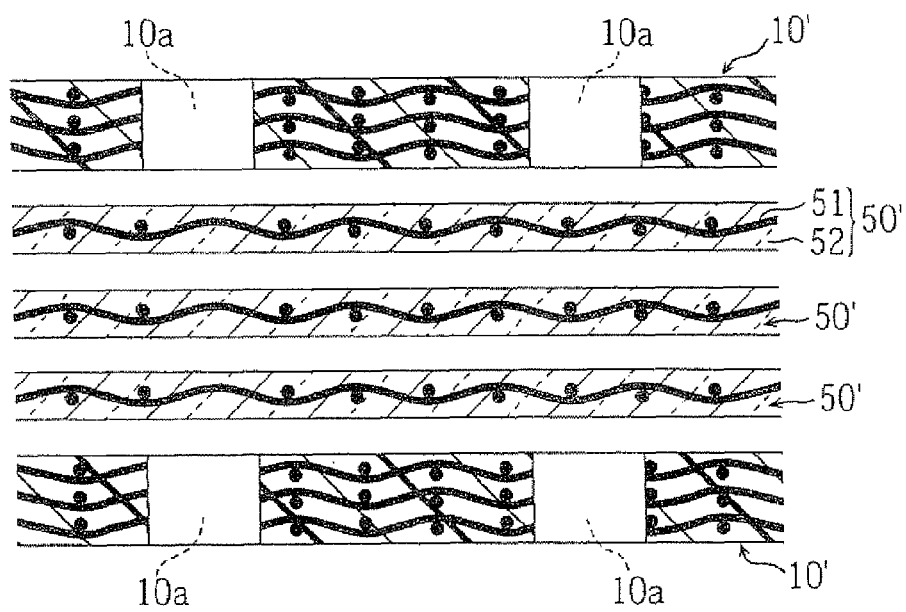

Then the two CFRP plates 10' created in the above manner and three GFRP plates 50' are laid up in the order shown in FIG. 10C. Each GFRP plate 50' is composed of the glass fiber material 51, and the resin material 52 which wraps the glass fiber material in the uncured state.

Next, as shown in FIG. 110D, under a predetermined pressure or temperature, the CFRP plates 10' are pressure-bonded via the three GFRP plates 50'. At this time, the through-hole 10a of the CFRP plate 10 is packed with the resin material 52 of the GFRP plate 50'. In the present embodiment, the resin material 52 pushes out the foams from within the direction of the thickness of the laminated structural body to enter into each through-hole 10a provided in the CFRP plate 10'. As a result, it is possible to pack the through-holes 10a appropriately while preventing the foams from being mixed into the through-holes 10a in the CFR portion 10. A portion of the resin material 52 packing the through-holes 10a is then processed to the insulating resin portion 13 of the CFR portion 10. In this manner, the laminated structural body composed of the GFR portion 50 and CFR portion 10 is formed.

Figure 10D:
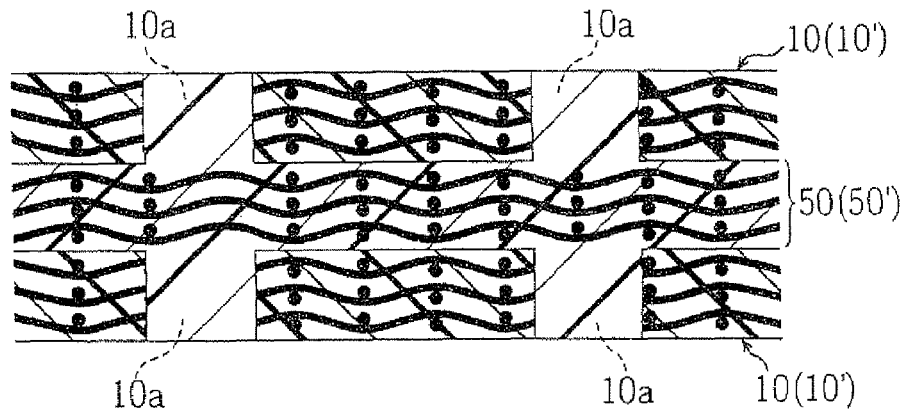

Then, a laminated structural body shown in FIG. 10D is used instead of the CFRP plate 10' to carry out the steps described above with reference to FIG. 3A and FIG. 3B in the first embodiment. Accordingly, the innermost insulating layer 21 and the copper foil 22' of the in-core wiring portion 20 are laminated with respect to the laminated structural body, substantially similarly to the one shown in FIG. 3B. At this time, however, since the through-hole 10a is already packed with the resin material, the resin material 12 originating in the prepreg 21' is not packed into the through-hole 10a.

Thereafter, by undergoing the same steps as those described above with reference to FIG. 3C to FIG. 7D regarding the first embodiment, the multilayer wiring board X2 of the present embodiment can be manufactured.

The multilayer wiring board X2 is, as with the multilayer wiring board X1, comprises the build-up portion 30 having the electrode pad 32a which can be provided in fine pitch as a terminal for external connection. Therefore, the multilayer wiring board X2 is suitable for mounting or loading a semiconductor chip in which the electrodes for external connection are formed in fine pitch.

The CFR portion 10 of the multilayer wiring board X2 comprises the carbon fiber material 11 having an extremely small coefficient of thermal expansion. The average coefficient of thermal expansion between 25° C. and 150° C. of the entire multilayer wiring board X2 having such CFR portion 10 is, in the present embodiment, 3 to 5 ppm/° C. In such multilayer wiring board X2 with a small coefficient of thermal expansion, the difference in the coefficient of thermal expansion between the semiconductor chips is small, thus deterioration of the connection reliability due to the difference in the coefficient of thermal expansion can be suppressed in a state where the semiconductor chips are loaded.

As described above, in the present embodiment the foams are appropriately prevented from being mixed into the through-hole 10a in the CFR portion 10. If the foams are mixed in when packing the through-hole 10a with the resin material, electrical insulation may not be secured between the carbon fiber material 11 and through-hole via 40. Specifically, when the foams are mixed in when packing the through-hole 10a with the resin material, the foams that were till then closed are opened when forming the through-hole 100a that passes through the resin material, whereby the carbon fiber material 11 is often exposed to the through-hole 100a. When the carbon fiber material 11 is exposed as above, the though-hole via 40 formed in the through-hole 100a contacts with the carbon fiber material 11, and then a short occurs.

Moreover, in the multilayer wiring board X2, as with the multilayer wiring board X1, good bonded states are achieved between the CFR portion 10 and in-core wiring portion 20, as well as between the in-core wiring portion 20 and build-up portion 30.

Example 1

Creating a Multilayer Wiring Board

In this example, a compound of a carbon fiber cloth with an epoxy resin was used as a CFRP material. In creating a CFRP plate for this example, first of all, the carbon fiber cloth (Trade name: TORAYCA, produced by Toray Industries, Inc.) was impregnated with epoxy resin varnish (varnish which contains monomer or the like that is polymerized into epoxy resin), which is thereafter dried, and a prepreg with a thickness of 0.2 mm is created. This carbon fiber cloth is a plain fabric woven out of carbon fiber yarn which is obtained by bundling together an average of at least 1000 carbon fibers each of which has a cross-sectional diameter of 10 μm or less. Five of the prepreg prepared in the above manner were laminated and pressed in the lamination direction by a vacuum press for 30 minutes at a peak temperature of 200° C., thereby creating an unprocessed CFRP plate having a thickness of approximately 1.0 mm. The pressure to be applied at this moment was set to 40 kgf/cm2. The average coefficient of thermal expansion between 25° C. and 150° C. in a spread direction of the surface of the CFRP plate was 1 ppm/° C.

Next, a through-hole with a mouth diameter of 0.8 mm was formed by means of a drill in a predetermined area of this CFRP plate.

Then, a prepreg with 0.1 mm thickness and copper foil with 18 μm thickness were integrated by integrally laminating them on both faces of the CFRP plate from the side of the CFRP plate by using a vacuum press. The prepreg is an FR-4 prepreg (Trade name: R-1650, produced by Matsushita Electric Works, Ltd.) in which a glass cloth is compounded with an epoxy resin. The copper foil is electrolytic copper foil whose elastic modulus is set to 22 GPa by subjecting the copper foil to an annealing treatment (Trade name: F1-WS, produced by Furukawa Circuit Foil Co., Ltd.). The press conditions were peak temperature=185° C., pressing time=2 hours, and pressure=30 kgf/cm2. At this time, the through-hole on the CFRP plate was packed with a portion of the resin of the prepreg which is bonded to each surface of the CFRP plate.

Next, the prepreg with a thickness of 0.1 mm, a laminated plate having a thickness of 0.1 mm and having a predetermined wiring pattern on both faces thereof, a prepreg with a thickness of 0.1 mm, and copper foil with a thickness of 5 μm were integrated by integrally laminating them, by using a vacuum press, on the both faces of the laminated structural body obtained in the above manner. This prepreg is an FR-4 prepreg (Trade name: R-1650, produced by Matsushita Electric Works, Ltd.) in which a glass cloth is compounded with an epoxy resin. The laminated plate is obtained by sticking the electrolytic copper foil (Trade name: F1-WS, produced by FURUKAWA CIRCUIT FOIL Co., Ltd.), which was subjected to an annealing treatment to have an elastic modulus of 10 to 40 GPa, to both faces of the FR-4 prepreg (Trade name: R-1650, produced by Matsushita Electric Works, Ltd.) in which a glass cloth is compounded with an epoxy resin, so as to form a predetermined wiring pattern from the above copper foil. The press conditions were peak temperature=185° C., press time=30 minutes, pressure=30 kgf/cm2. Consequently, a core board (with a thickness of approximately 1.8 mm), which comprises a CFR portion and two in-core wiring portions that are bonded to the both faces of the CFR portion, was created. The average coefficient of thermal expansion between 25° C. and 150° C. in a spread direction of the surface of the core board was 2.0 ppm/° C.

Next, a through-hole having a mouth diameter of 0.35 mm was formed on this core board by means of a drill so as to pass through substantially a center of the through-hole of the CFRP plate.

Along with formation of a through-hole via on the through-hole, a predetermined wiring pattern was formed on the surface of the core board by means of a semi-additive process Specifically, first, a desmear treatment was performed on the inner wall of the through-hole, and thereafter, an electroless copper plating film was formed on the inner wall of the through-hole and on an unprocessed copper foil by means of electroless plating. A resist pattern with a pattern shape corresponding to the predetermined wiring pattern is then formed on the unprocessed copper foil. In formation of the resist pattern, first of all, a dry film resist (Trade name: NIT-240, produced by Nichigo-Morton Co., Ltd.) was stuck to the surface of the copper foil, which thereafter underwent exposure and development, and then the resist pattern having a pattern shape corresponding to the wiring pattern, which is the object of formation, is formed. Next, by means of electroplating, the electroless copper plating film was used as a seed layer to grow an electroplated copper film on the electroless copper plating film. Consequently, the through-hole via was formed on the through-hole. Next, the resist pattern was removed, and thereafter the copper foil, which was not covered with the electroplated copper film, and the electroless copper plating film thereon were removed by etching. Cupric chloride solution was used as an etchant. And then, 3 wt % of aqueous sodium hydroxide was used to separate the resist pattern. Accordingly, the lowermost or innermost wiring pattern of the build-up portion was formed on the surface of the core board. The through-hole in which the through-hole via was already formed in the above-described manner was packed with the epoxy resin.

Then, a build-up insulating layer was formed on both faces of the core board. In formation of a build-up insulating layer, first of all, a thermoplastic polyimide resin sheet (Trade name: ESPANEX, produced by Nippon Steel Chemical Group) was laminated on both faces of the core board under conditions where the peak temperature was 200° C. and the time was 30 minutes by means of a vacuum press such that the thickness of the thermoplastic polyimide resin sheet becomes 0.05 mm. The average coefficient of thermal expansion between 25° C. and 150° C. of this polyimide layer was 60 ppm/° C. A via-hole was then formed in a predetermined area on the build-up insulating layer by means of a UV-YAG laser.

Next, a copper wiring pattern was formed on the insulating layer by means of a semi-additive process. At this time, by depositing copper on the via hole surface as well, a via was formed along with the copper wiring pattern. Specifically, first, the insulating layer surface and the via hole surface were subjected to a desmear treatment, and thereafter an electroless copper plating film was formed on the surface of the insulating layer and of the via hole by means of electroless plating. Next, a photoresist is formed on the electroless copper plating film, which is exposed to light and developed, thereby forming a resist pattern. This resist pattern has a pattern shape corresponding to the wiring pattern which is the object of formation. Then by means of electroplating, the electroless copper plating film was used as a seed layer to deposit the electroplated copper on the electroless plating film, which is not masked with the resist pattern. The resist pattern was then removed by etching, and then the electroless copper plating film which was till then covered with the resist pattern was removed by etching. By means of such semi-additive process, the wiring pattern and the via were formed on the build-up insulating layer.

Subsequently a series of steps ranging from the lamination formation of the build-up insulating layer to the formation of the wiring pattern and the via was repeated three times on both faces of the core board, whereby a build-up portion having five layers of wiring structure on the both faces of the core board was formed.

Then, an overcoat layer was formed on the surface of the build-up portion by means of screen printing and photolithography. An opening portion was provided in a predetermined area of the overcoat layer such that a part of the uppermost wiring pattern in the build-up portion faces as an electrode pad.

The average coefficient of thermal expansion between 25° C. and 150° C. in a spread direction of the surface of the multilayer wiring board created as above was 4.0 ppm/° C. When measuring coefficient of thermal expansion, an apparatus for thermomechanical analysis (Trade name: TMA 6000, produced by Seiko Instruments Industry Co.) in the form of differential dilatometer was used. Further, when the warpage of the multilayer wiring board was measured, it was 10 μm or less in a span of 20 mm of the chip loaded area which is provided on the surface of the multilayer wiring board.

<Temperature Cycling Test>

A predetermined semiconductor chip having a plurality of bump electrodes for external connection was loaded onto the multilayer wiring board for this example without using an underfill agent, to examine the connection reliability between the semiconductor chip and the multilayer wiring board by means of a temperature cycling test. Specifically, first, an initial conduction resistance was measured for each electrical connection portion between the semiconductor chip and the multilayer wiring board. A temperature cycling test was performed in a temperature range of −65° C. to 125° C., and thereafter the conduction resistance of each electrical connection portion was measured again. The temperature cycling test was repeated one thousand times in which one cycle consists of 30 minute cooling in −65° C. and 30 minute heating in 125° C. As a result, it was confirmed that a resistance rate of change for each electrical connection portion was less than 10%, and that a good connection was maintained. After one thousand cycles, no crack or peeling has occurred between the bump electrodes of the semiconductor chip and the electrode pad of the multilayer wiring board.

Moreover, after one thousands cycles, the multilayer wiring board of this example was polished, the cross section thereof was exposed, and the exposed cross section was observed by using an optical microscope. As a result, again no peeling was observed between the CFR portion and in-core wiring portion and between the in-core wiring portion and build-up portion (out-core wiring portion).

Example 2

Creating a Multilayer Wiring Board

In this example a compound of a carbon fiber cloth and epoxy resin was used as a CFRP material. In creating a CFRP plate for this example, first of all, the carbon fiber cloth (Trade name: TORAYCA, produced by Toray Industries, Inc.) was impregnated with epoxy resin varnish (varnish which contains monomer or the like that is polymerized into epoxy resin), which is thereafter dried, and a prepreg with a thickness of 0.2 mm is created. This carbon fiber cloth is same as that of Example 1. Three of the prepreg prepared in the above manner were laminated and pressed in the lamination direction by a vacuum press for 30 minutes at a peak temperature of 200° C., thereby creating an unprocessed CFRP plate having a thickness of approximately 0.6 mm. The pressure to be applied at this moment was set to 40 kgf/cm2. The average coefficient of thermal expansion between 25° C. and 150° C. in the spread direction of the surface of the CFRP plate was 0.5 ppm/° C. Thereafter, a through-hole with a mouth diameter of 0.8 mm was formed by means of a drill in a predetermined area of this CFRP plate. In this manner, two of the CFRP plate provided with a plurality of through-holes (φ 0.8 mm) with a thickness of 0.6 mm were created.

The two CFRP plates created in the above manner were pressure-bonded by pressurizing it in the lamination direction for thirty minutes at a peak temperature of 180° C. by means of a vacuum press through three GFRP plates. Each of the GFRP plates was an FR-4 prepreg (Trade name: R-1650, produced by Matsushita Electric Works, Ltd.) in which a glass cloth is compounded with an epoxy resin, and has a thickness of 0.1 mm. At this time, the through-hole of the CFRP plate was packed with the epoxy resin originating in the GFRP plate.

Next, a prepreg with a thickness of 0.1 mm and copper foil with a thickness of 18 μm were integrated by integrally laminating them, by using a vacuum press, on both faces of the CFRP plate from the side of the CFRP plate. This prepreg is an FR-4 prepreg (Trade name: R-1650, produced by Matsushita Electric Works, Ltd.) in which a glass cloth is compounded with an epoxy resin. The copper foil is electrolytic copper foil whose elastic modulus is set to 22 GPa by subjecting the copper foil to an annealing treatment (Trade name: F1-WS, produced by Furukawa Circuit Co., Ltd.). The press conditions were peak temperature=185° C., pressing time=2 hours, and pressure=30 kgf/cm2. Next, as with Example 1, the prepreg with a thickness of 0.1 mm, a laminated plate having a thickness of 0.1 mm and having a predetermined wiring pattern on both faces thereof a prepreg with a thickness of 0.1 mm, and copper foil with a thickness of 5 μm were integrated by integrally laminating them, by using a vacuum press, on the both faces of the laminated structural body obtained in the above manner from the sides of the laminated structural body, whereby a core board was created. The average coefficient of thermal expansion between 25° C. and 150° C. in the spread direction of the surface of the core board of this example was 2.0 ppm/° C.

Next, a through-hole having a mouth diameter of 0.35 mm was formed on this core board by means of a drill so as to pass through substantially a center of the through-hole of the CFRP plate.

Subsequently, as with Example 1, by performing formation of a wiring pattern and through-hole via on the surface of the core board and formation of an overcoat layer, a multilayer wiring board of this example, which has a laminated structure of the GFR portion, CFR portion, in-core wiring portion and build-up portion, was created.

The average coefficient of thermal expansion between 25° C. and 150° C. in the spread direction of the surface of the multilayer wiring board of this example was 4.0 ppm/° C. When measuring coefficient of thermal expansion, an apparatus for thermomechanical analysis (Trade name: TMA 6000, produced by Seiko Instruments Industry Co.) in the form of differential dilatometer was used. Further, when the warpage of the multilayer wiring board was measured, it was 10 μm or less in a span of 20 mm of the chip loaded area which is provided on the surface of the multilayer wiring board.

<Temperature Cycling Test>

A predetermined semiconductor chip having a plurality of bump electrodes for external connection Was loaded onto the multilayer wiring board for this example without using an underfill agent, to examine, as in Example 1, the connection reliability between the semiconductor chip and the multilayer wiring board by means of a temperature cycling test. As a result, it was confirmed that a resistance rate of change for each electrical connection portion was less than 10%, and that a good connection portion was formed. Further, after one thousand cycles, no crack or peeling has occurred between the bump electrodes of the semiconductor chip and the electrode pad of the multilayer wiring board.

Moreover, the cross section of the multilayer wiring board of this example which underwent one thousand cycles was observed, and, as a result, again no peeling was observed between the CFR portion and in-core wiring portion and between the in-core wiring portion and build-up portion.

Comparative Example 1

Instead of the core board of Example 1, an organic core board of the same size was prepared, and a build-up portion was formed in this organic core board as in Example 1, whereby a multilayer wiring board for this comparative example was created. The organic core board is obtained by forming, on both faces of a BT resin board, the in-core wiring portion having the same number of wiring layers as in Example 1. The copper wiring pattern in this in-core wiring portion is formed from electrolytic copper foil which did not undergo an annealing treatment, and has an elastic modulus of 72 GPa. When the warpage of the organic core multilayer wiring board of this comparative example was measured, it was approximately 30 μm in a span of 20 mm of the chip loaded area. Furthermore, a predetermined semiconductor chip having a plurality of bump electrodes for external connection was loaded onto the organic core multilayer wiring board of this comparative example without using an underfill agent, to examine the connection reliability between the semiconductor chip and multilayer wiring board by means of a temperature cycling test, as was carried out in Example 1. As a result, at the 1000th cycle, there was a bonded portion in which a crack was observed on the interface between the bump electrodes of the semiconductor chip and the electrode pad of the multilayer wiring board.

EVALUATION

According to the temperature cycling test in a state where the semiconductor chip is loaded, it is found that the multilayer wiring board of Example 1 and of Example 2 has higher connection reliability between the semiconductor chips than the conventional organic core multilayer wiring board related to Comparative Example 1I the multilayer wiring board of Example 1 and Example 2 comprising a CFR portion whose coefficient of thermal expansion in the in-plane direction is made small properly by containing a carbon fiber cloth, and an in-core wiring portion having a wiring pattern formed from electrolytic copper foil of a low elastic modulus of 22 GPa. Since the CFR portion with an extremely low coefficient of thermal expansion exists, and since the elastic modulus is low enough that the wiring pattern of the in-core wiring portion does not hamper the characteristics of low coefficient of thermal expansion of the core board, the coefficient of thermal expansion in the in-plane direction in the core board or multilayer wiring board is appropriately controlled small. As a result, it is considered that high reliability can be obtained in the multilayer wiring board of Example 1 and of Example 2.

According to the present invention, therefore, lowering of coefficient of thermal expansion can be appropriately achieved in a multilayer wiring board. Such a wiring board is fundamentally suitable for loading a semiconductor chip having a low coefficient of thermal expansion, and can be applied to a semiconductor chip mounting board, mother board, probe card board and the like.

What is claimed is:

1. A method for manufacturing a multilayer wiring board, comprising:

annealing a conductive foil such that an elastic modulus of the conductive foil becomes 10 to 40 GPa;

attaching the annealed conductive foil to a carbon fiber reinforced portion composed of a carbon fiber material and resin composition;

forming the annealed conductive foil into a first wiring pattern;

forming an insulating layer over the first wiring pattern to provide a first wiring portion including a laminated structure of the insulating layer and the first wiring pattern, the insulating layer containing a glass fiber material; and forming a second wiring portion on the first wiring portion, the second wiring portion including a laminated structure of an insulating layer and a second wiring pattern.

2. The method for manufacturing a multilayer wiring board according to claim 1, wherein the conductive foil is electrolytic copper foil, and the electrolytic copper foil is annealed at 200 to 300° C. in the annealing.

3. The method for manufacturing a multilayer wiring board according to claim 1, wherein the conductive foil is rolled copper foil, and the rolled copper foil is annealed at 150 to 250° C. in the annealing.

* * * * *